US012562357B2

(12) United States Patent
Lim et al.

(10) Patent No.: US 12,562,357 B2
(45) Date of Patent: Feb. 24, 2026

(54) APPARATUS FOR MONITORING A PLASMA PROCESS

(71) Applicant: SAMSUNG ELECTRONICS CO., LTD., Suwon-si (KR)

(72) Inventors: Meehyun Lim, Suwon-si (KR); Sungyeol Kim, Suwon-si (KR); Taekjin Kim, Suwon-si (KR); Minsung Kim, Suwon-si (KR); Hosun Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 400 days.

(21) Appl. No.: 18/203,864

(22) Filed: May 31, 2023

(65) Prior Publication Data
US 2023/0317439 A1 Oct. 5, 2023

Related U.S. Application Data

(63) Continuation of application No. PCT/KR2020/017588, filed on Dec. 4, 2020.

(51) Int. Cl.
*H01J 37/32* (2006.01)
*G02F 1/035* (2006.01)

(52) U.S. Cl.
CPC ........ *H01J 37/32935* (2013.01); *G02F 1/035* (2013.01); *H01J 37/32091* (2013.01); *H01J 37/321* (2013.01); *H01J 37/32642* (2013.01); *H01J 2237/334* (2013.01)

(58) Field of Classification Search
CPC ............... H01L 21/67253; C23C 16/52; H01J 2237/334; H01J 37/32935; H01J 37/32091; H01J 37/321; H01J 37/32642; H01J 2237/332–3348; G02F 1/035
USPC ................................................. 118/715–733
See application file for complete search history.

(56) References Cited

U.S. PATENT DOCUMENTS

| | | | |
|---|---|---|---|
| 8,545,669 B2 | 10/2013 | Mahoney et al. | |
| 8,894,804 B2 | 11/2014 | Booth et al. | |
| 9,017,513 B2 | 4/2015 | Gosselin | |
| 12,105,132 B2 * | 10/2024 | Yun | ........................ H01L 22/12 |

(Continued)

FOREIGN PATENT DOCUMENTS

| | | | |
|---|---|---|---|
| JP | 1996-146051 A | | 6/1996 |
| JP | 2003217897 A | * | 7/2003 |

(Continued)

OTHER PUBLICATIONS

International Search Report dated Aug. 30, 2021 for PCT/KR2020/017588.

*Primary Examiner* — Charlee J. C. Bennett
(74) *Attorney, Agent, or Firm* — Muir Patent Law, PLLC

(57) ABSTRACT
An apparatus for monitoring a plasma process may include an electro-optical (EO) sensor module and an optical guide, the EO sensor module may be arranged in a plasma chamber configured to perform a semiconductor process for processing a substrate using plasma, the EO sensor module may include a non-conductive material having an optical refractive index changed by an electric field formed in the plasma chamber, the optical guide may form at least one internal path of a light, which may have an optical characteristic changed by the changed optical refractive index, between the EO sensor module and the plasma chamber.

20 Claims, 22 Drawing Sheets

(56)                    References Cited

U.S. PATENT DOCUMENTS

| | | | |
|---|---|---|---|
| 2004/0016402 A1 | 1/2004 | Walther et al. | |
| 2005/0009347 A1* | 1/2005 | Matsumoto | H01J 37/32174 |
| | | | 257/E21.252 |
| 2007/0022832 A1 | 2/2007 | Hunter | |
| 2015/0236475 A1* | 8/2015 | Kasper | H01S 3/06754 |
| | | | 359/341.3 |
| 2016/0377660 A1* | 12/2016 | Müller | G01R 19/32 |
| | | | 324/96 |
| 2018/0286650 A1* | 10/2018 | Bullock | H04N 25/46 |
| 2019/0056443 A1 | 2/2019 | Fukui et al. | |
| 2019/0113565 A1 | 4/2019 | Kim et al. | |
| 2020/0255946 A1 | 8/2020 | Peng et al. | |
| 2021/0140824 A1* | 5/2021 | Lin | G01J 3/027 |
| 2023/0168278 A1* | 6/2023 | Jung | G02B 27/283 |
| | | | 324/537 |
| 2024/0355600 A1 | 10/2024 | Kapoor et al. | |
| 2025/0218752 A1* | 7/2025 | Oh | H01L 21/67253 |

FOREIGN PATENT DOCUMENTS

| | | | |
|---|---|---|---|
| JP | 2011-106943 A | | 6/2011 |
| JP | 2014-063124 A | | 4/2014 |
| KR | 101000939 B1 | * | 12/2010 |
| KR | 10-2016-0039043 A | | 4/2016 |
| KR | 10-2017-0020096 A | | 2/2017 |
| KR | 10-2017-0055824 A | | 5/2017 |
| TW | 202044324 A | | 12/2020 |

* cited by examiner

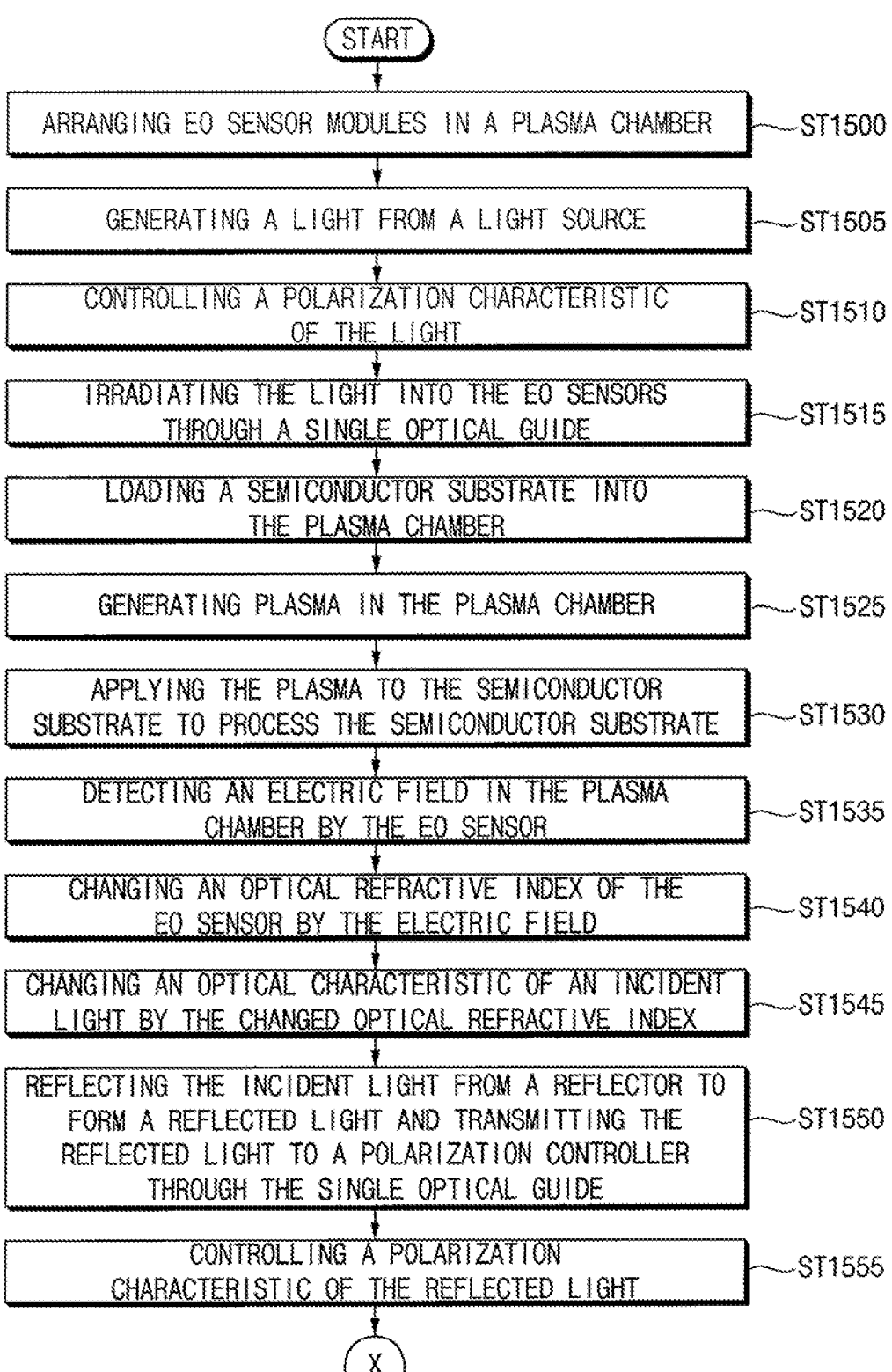

START

ARRANGING EO SENSOR MODULES IN A PLASMA CHAMBER ——ST1500

GENERATING A LIGHT FROM A LIGHT SOURCE ——ST1505

CONTROLLING A POLARIZATION CHARACTERISTIC OF THE LIGHT ——ST1510

IRRADIATING THE LIGHT INTO THE EO SENSORS THROUGH A SINGLE OPTICAL GUIDE ——ST1515

LOADING A SEMICONDUCTOR SUBSTRATE INTO THE PLASMA CHAMBER ——ST1520

GENERATING PLASMA IN THE PLASMA CHAMBER ——ST1525

APPLYING THE PLASMA TO THE SEMICONDUCTOR SUBSTRATE TO PROCESS THE SEMICONDUCTOR SUBSTRATE ——ST1530

DETECTING AN ELECTRIC FIELD IN THE PLASMA CHAMBER BY THE EO SENSOR ——ST1535

CHANGING AN OPTICAL REFRACTIVE INDEX OF THE EO SENSOR BY THE ELECTRIC FIELD ——ST1540

CHANGING AN OPTICAL CHARACTERISTIC OF AN INCIDENT LIGHT BY THE CHANGED OPTICAL REFRACTIVE INDEX ——ST1545

REFLECTING THE INCIDENT LIGHT FROM A REFLECTOR TO FORM A REFLECTED LIGHT AND TRANSMITTING THE REFLECTED LIGHT TO A POLARIZATION CONTROLLER THROUGH THE SINGLE OPTICAL GUIDE ——ST1550

CONTROLLING A POLARIZATION CHARACTERISTIC OF THE REFLECTED LIGHT ——ST1555

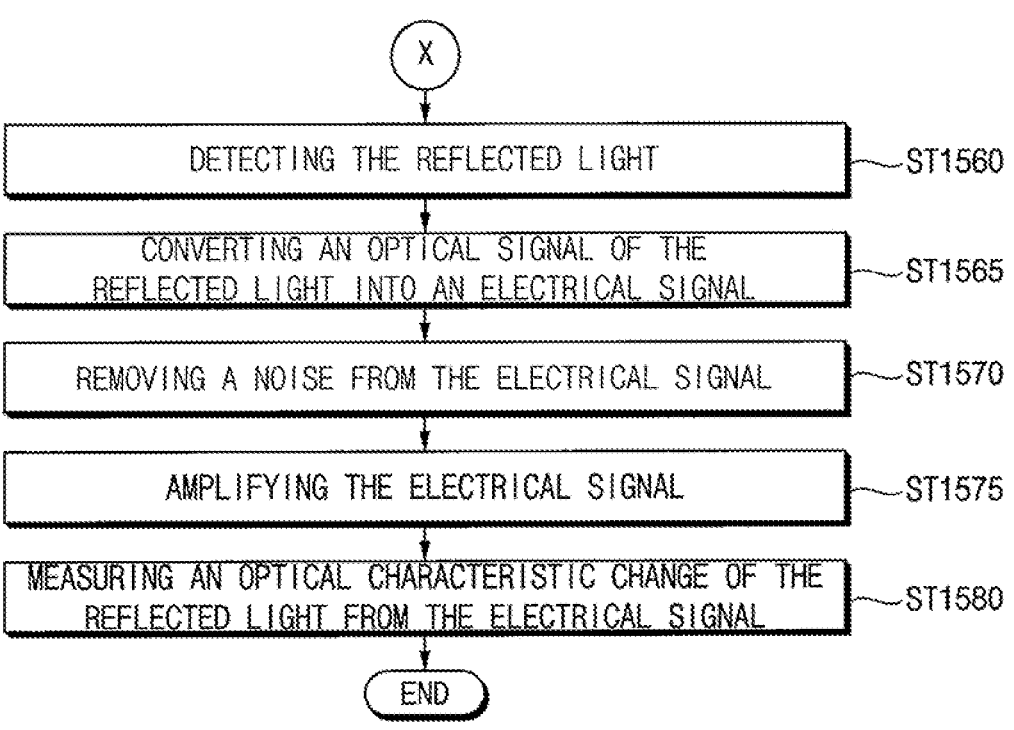

( X )

DETECTING THE REFLECTED LIGHT ——ST1560

CONVERTING AN OPTICAL SIGNAL OF THE
REFLECTED LIGHT INTO AN ELECTRICAL SIGNAL ——ST1565

REMOVING A NOISE FROM THE ELECTRICAL SIGNAL ——ST1570

AMPLIFYING THE ELECTRICAL SIGNAL ——ST1575

MEASURING AN OPTICAL CHARACTERISTIC CHANGE OF THE
REFLECTED LIGHT FROM THE ELECTRICAL SIGNAL ——ST1580

( END )

FIG. 27

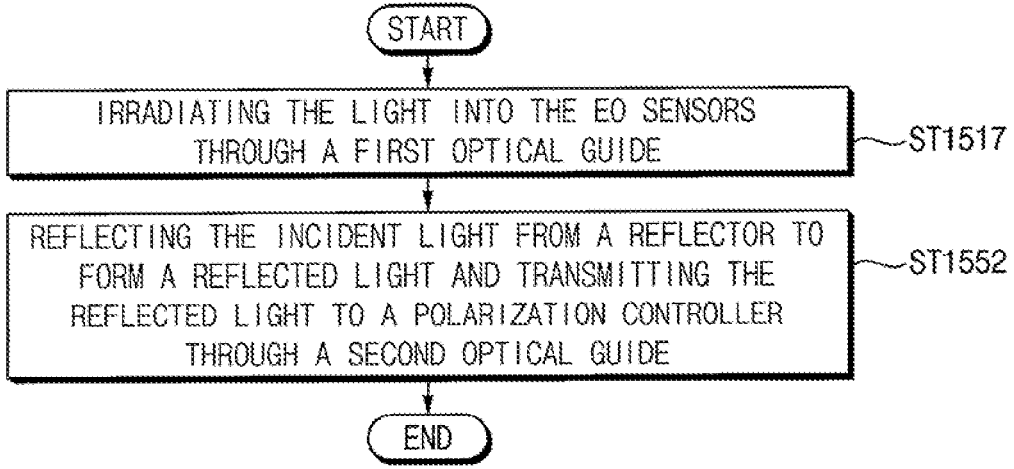

( START )

IRRADIATING THE LIGHT INTO THE EO SENSORS
THROUGH A FIRST OPTICAL GUIDE ——ST1517

REFLECTING THE INCIDENT LIGHT FROM A REFLECTOR TO
FORM A REFLECTED LIGHT AND TRANSMITTING THE
REFLECTED LIGHT TO A POLARIZATION CONTROLLER
THROUGH A SECOND OPTICAL GUIDE ——ST1552

( END )

APPARATUS FOR MONITORING A PLASMA PROCESS

CROSS-REFERENCE TO RELATED APPLICATION

This application is a continuation of International Application No. PCT/KR2020/017588, which was filed on Dec. 4, 2020, the entire contents of which are hereby incorporated by reference.

BACKGROUND

1. Field

Example embodiments relate to a method and an apparatus for monitoring a plasma process and method of processing a substrate using the monitoring method. More particularly, example embodiments relate to a method and an apparatus for monitoring a distribution of a plasma density in a semiconductor process using plasma, and a method of processing a substrate using the monitoring method.

2. Description of the Related Art

Generally, a plasma apparatus may form a layer on a substrate or etch the layer on the substrate using plasma. In order to form a layer having a uniform thickness on the substrate or to etch a layer to have a uniform thickness, it may be necessary to provide plasma with a uniform density. To achieve this goal, the plasma density may be monitored in a semiconductor process using the plasma.

In related arts, a measuring device, such as a sensor configured to measure plasma density, may include a conductive material. However, the conductive measuring device may act as noise that interferes with a measurement of uniform distribution of the plasma in a plasma chamber. Therefore, the distribution of the plasma density may not be accurately measured using a conductive measuring device.

SUMMARY

According to embodiments, an apparatus for monitoring a plasma process may be provided. The apparatus may include an electro-optical (EO) sensor module and an optical guide. The EO sensor module may be arranged in a plasma chamber that is configured to perform a semiconductor process for processing a substrate using plasma. The EO sensor module may include a non-conductive material having an optical refractive index that is changed by an electric field formed in the plasma chamber. The optical guide may form at least one internal path of a light, which may have an optical characteristic that is changed by a changed optical refractive index between the EO sensor module and the plasma chamber.

According to embodiments, an apparatus may be provided for monitoring a plasma process. The apparatus may include an optical probing module configured to irradiate a light into an internal apparatus of a plasma chamber and to detect the light reflected from the internal apparatus of the plasma chamber, the internal apparatus of the plasma chamber including an electro-optical (EO) sensor module arranged in the plasma chamber configured to perform a semiconductor process for processing a substrate using plasma, the EO sensor module including a non-conductive material having an optical refractive index that is changed by an electric field formed in the plasma chamber, an optical guide configured to form at least one internal path of the light between the optical probing module and the plasma chamber, a signal processing module configured to convert an optical signal outputted from the optical probing module into an electrical signal; and a control module configured to measure an optical characteristic change of the light by the changed optical refractive index from the electrical signal.

According to embodiments, a method may be provided for monitoring a plasma process. The method may include performing a semiconductor process in a plasma chamber using plasma, applying an electric field in the plasma chamber to an electro-optical (EO) sensor, which includes a non-conductive material, arranged in the plasma chamber to change an optical refractive index of the EO sensor, irradiating a light to the EO sensor, reflecting the light from the EO sensor, detecting the reflected light; and measuring an optical characteristic change of the reflected light.

BRIEF DESCRIPTION OF THE DRAWINGS

Features will become apparent to those of skill in the art by describing in detail exemplary embodiments with reference to the attached drawings in which:

FIG. 4 is a cross-sectional view illustrating a CCP apparatus with the monitoring apparatus in FIG. 1 in accordance with example embodiments;

FIG. 6 is a cross-sectional view illustrating a CCP apparatus with the monitoring apparatus in FIG. 1 in accordance with example embodiments;

FIG. 11 is a cross-sectional view illustrating a CCP apparatus with the monitoring apparatus in FIG. 1 in accordance with example embodiments;

FIG. 20 is a cross-sectional view illustrating an ICP apparatus with the monitoring apparatus in FIG. 1 in accordance with example embodiments;

FIG. 21 is a cross-sectional view illustrating an ICP apparatus with the monitoring apparatus in FIG. 1 in accordance with example embodiments;

FIG. 22 is a cross-sectional view illustrating an ICP apparatus with the monitoring apparatus in FIG. 1 in accordance with example embodiments;

FIG. 23 is a cross-sectional view illustrating an ICP apparatus with the monitoring apparatus in FIG. 1 in accordance with example embodiments;

FIG. 24 is a cross-sectional view illustrating an ICP apparatus with the monitoring apparatus in FIG. 1 in accordance with example embodiments;

FIGS. 26A and 26B are flow charts illustrating a method of processing a substrate in accordance with example embodiments; and FIG. 27 is a flow chart illustrating a method of processing a substrate in accordance with example embodiments.

DETAILED DESCRIPTION

Hereinafter, example embodiments will be explained in detail with reference to the accompanying drawings.

Figure 1:
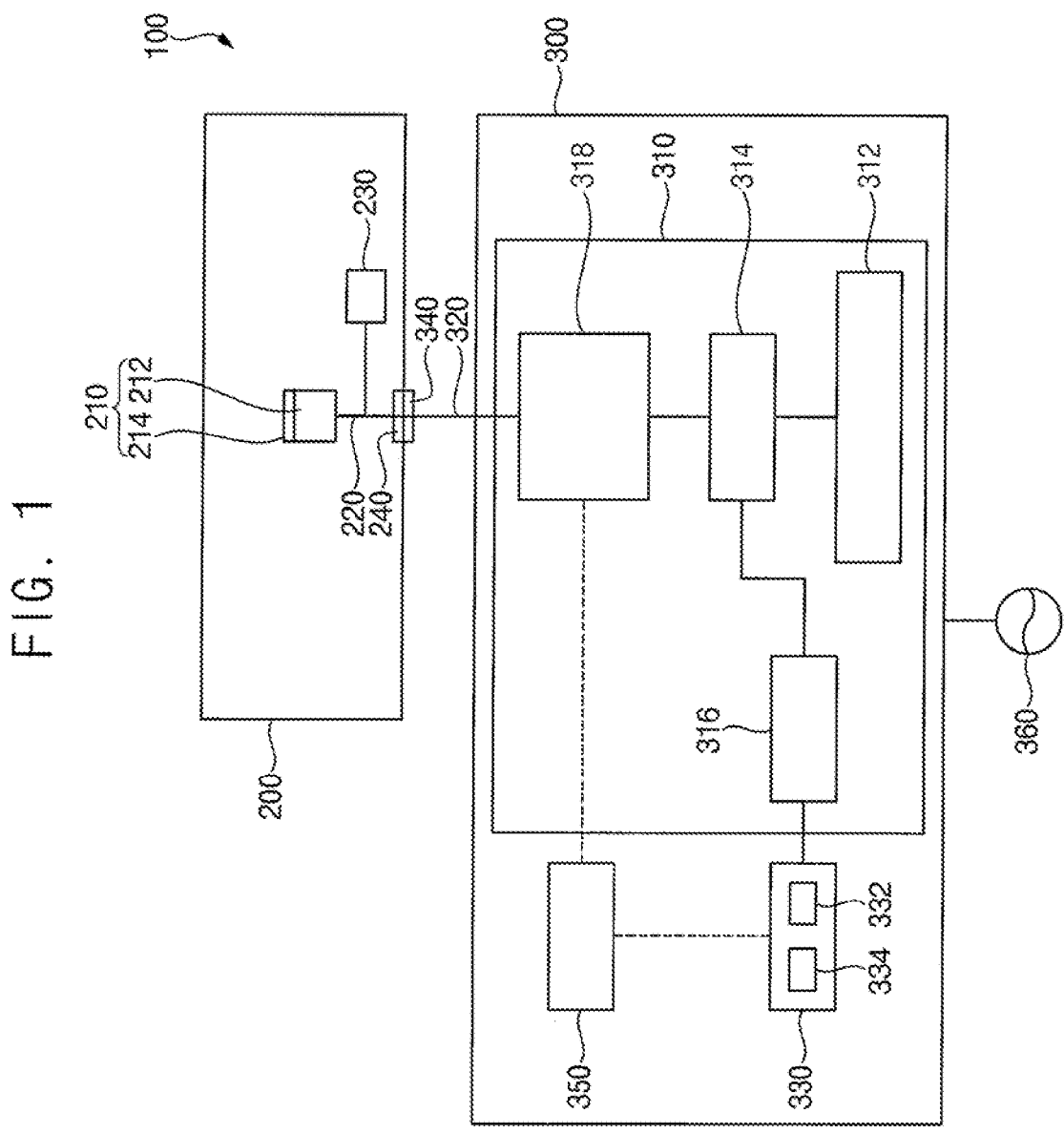
FIG. 1 is a block diagram illustrating an apparatus for monitoring a plasma process in accordance with example embodiments.

FIG. 1 is a block diagram illustrating an apparatus for monitoring a plasma process in accordance with example embodiments. In FIG. 1, a full line may represent a path of an optical signal and a dotted line may represent an electrical signal.

Referring to FIG. 1, a monitoring apparatus 100 of a plasma process in accordance with example embodiments may include an internal apparatus 200 of a plasma chamber and an optical measurement module 300.

A plasma process monitored by the monitoring apparatus 100 may include various semiconductor processes for processing a substrate in the plasma chamber using plasma, such as a process for forming a layer on a semiconductor substrate, a process for etching a layer on a semiconductor substrate, a process for ashing a photoresist film on a semiconductor substrate, etc.

In particular, the plasma etch process may include a dry etch process for forming a deep hole having a high aspect ratio, a process for forming a layer in a deep trench, etc. For example, a high aspect ratio contact (HARC) process may form a hole through an insulation layer to provide an electrical path in the insulation layer between conductive layers. The HARC process may include an etching process using the plasma.

The HARC process using a high aspect ratio may be greatly affected by a tilt along an etching direction, which could be caused by a difference between plasma densities generated in the plasma chamber. For example, an unbalance of the plasma density could change a direction of ion acceleration in the plasma from a vertical direction into a diagonal direction such that the hole having the high aspect ratio might not be accurately formed. Thus, a monitoring apparatus configured to accurately monitor a distribution of the plasma density in a plasma chamber is desirable.

The internal apparatus 200 of the plasma chamber may include an electro-optical (EO) sensor module 210, an internal optical guide 220, a cooler 230 and an internal optical connector 240.

The EO sensor module 210 may be arranged in the plasma chamber. Particularly, the EO sensor module 210 may be positioned adjacent to a space where plasma is formed in the plasma chamber.

In example embodiments, the EO sensor module 210 may include a non-conductive material. If a conductive sensor were to be positioned adjacent to a plasma-formation space, there is a possibility that the conductive sensor could generate electrical arcing or could distort the plasma such that the conductive sensor could act as a noise that hinders a uniform distribution of the plasma. In contrast, an EO sensor module 210 including a non-conductive material may not generate electrical arcing or distortion of the plasma. Accordingly, the EO sensor module 210 including the non-conductive material may not produce noise that hinders the uniform distribution of the plasma.

The EO sensor module 210 may have a small size. Thus, a plurality of the EO sensor modules 210 may be arranged in the plasma chamber. An internal space of the plasma chamber may be divided into a plurality of plasma spaces. Monitoring with respect to the plasma spaces may be independently performed.

The EO sensor module 210 may include an EO sensor 212 and a reflector 214. The EO sensor 212 and the reflector 214 may be positioned in the plasma chamber. The EO sensor 212 and the reflector 214 may include a non-conductive material such that the EO sensor 212 and the reflector 214 may not act as noise in the plasma. The EO sensor 212 may be arranged in the plasma chamber with an insulating structure including an insulation material. Further, the EO sensor module 210 may be embedded in the insulating structure.

The non-conductive material of the EO sensor 212 may have an optical refractive index that can be changed by an electric field formed in the plasma chamber. For example, the EO sensor 212 may include an EO crystal. The EO crystal may include a non-conductive material having a non-linear optical characteristic such as $LiTaO_3$, $LiNbO_3$, ZnTe, etc., as examples.

The optical refractive index may be changeable linearly in accordance with an intensity of a light. This electro-optical effect may be referred to as "Pokels effect". The change of the optical refractive index of the EO sensor 212 can be attributed to a change in the electric field of the plasma. Accordingly, a change of the optical refractive index of the EO sensor 212 may coincide with a change in the density of the plasma.

The reflector 214 may reflect light that is incident to the EO sensor 212. The light may be incident to the EO sensor 212 through a first surface of the EO sensor 212. The reflector 214 may be arranged at a second surface of the EO sensor 212 opposite to the first surface. Therefore, light that is incident through the first surface of the EO sensor 212 may be reflected toward the first surface of the EO sensor 212 by the reflector 214 positioned at the second surface of the EO sensor 212. Since the reflector 214 is typically positioned in the plasma chamber, the reflector 214 may also include a non-conductive material.

The internal optical guide 220 may be connected to the EO sensor 212. The internal optical guide 220 may form an internal path of light in the plasma chamber. Thus, light may be incident to the EO sensor 212 through the internal optical guide 220 from an exterior of the plasma chamber. Further, light reflected from the reflector 214 may be transmitted to the exterior of the plasma chamber through the internal optical guide 220. Since the internal optical guide 220 is typically positioned in the plasma chamber, the internal optical guide 220 may also include a non-conductive material. In example embodiments, the internal optical guide 220 may include an optical fiber, as an example.

The internal optical guide 220 in the plasma chamber may be exposed to a high temperature in the plasma chamber. The cooler 230 may be used cool the internal optical guide 220. The cooler 230 may provide the internal optical guide 220 with a coolant. For example, the cooler 230 may be configured to surround the internal optical guide 220. The coolant may be supplied through a cooling passage in the cooler 230 to cool the internal optical guide 220. The cooling manner of the cooler 230 may vary and may not be restricted to a specific manner. For example, the cooler 230 may be positioned outside the plasma chamber. In this case, the cooler 230 may supply the coolant to the internal optical guide 220 through a cooling passage formed in the plasma chamber.

The internal optical connector 240 may be installed at an inner wall of the plasma chamber. The internal optical guide 220 may be connected to the internal optical connector 240. The optical measurement module 300 may be selectively connected to the internal optical connector 240.

The optical measurement module 300 may be positioned outside the plasma chamber. The optical measurement module 300 may irradiate a light to the EO sensor module 210. As mentioned above, when an electric field in a plasma chamber is applied to the EO sensor module 210, the optical refractive index of the EO sensor 212 may be changed. Thus, the optical characteristic of light incident to the EO sensor module 210 may also be changed. The optical measurement module 300 may detect the light reflected from the EO sensor module 210. The optical measurement module 300 may measure the change of the optical characteristic of the light. In some implementations, the optical measurement module 300 may be arranged in a non-vacuum region of the plasma chamber. For example, the optical measurement module 300 may be arranged on an inner surface or a bottom surface of the plasma chamber.

The optical measurement module 300 may include an optical probing module 310, an external optical guide 320, a signal-processing module 330, an external optical connector 340, a control module 350 and a power source 360.

The optical probing module 310 may irradiate light to the EO sensor 212 of the EO sensor module 210. The optical probing module 310 may detect the light reflected from the reflector 214. The optical probing module 310 may include a light source 312, a detector 316, a polarization controller 318 and a circulator 314.

The light source 312 may generate light. In example embodiments, the light source 312 may include a laser source, a LED, etc., as examples.

The detector 316 may detect the light reflected from the EO sensor module 210. As mentioned above, the optical refractive index of the EO sensor 212 can be changed by the electric field in the plasma chamber. Accordingly, the light reflected from the EO sensor 212 may have a changed optical characteristic due to the changed optical refractive index of the EO sensor 212. Thus, the light detected by the detector 316 may contain information with respect to the density of the plasma.

The polarization controller 318 may control polarization characteristics of the light incident to the EO sensor module 210, i.e., the reflected light. The polarization controller 318 may be arranged between the light source 312 and the internal apparatus 200 of the plasma chamber, as an example.

The circulator 314 may be arranged between the light source 312 and the polarization controller 318. The circulator 314 may branch the light incident to the EO sensor module 210 and the light reflected from the EO sensor module 210 in the external optical guide 320. The circulator 314 may transmit the branched light to the detector 316.

The external optical guide 320 may connect the optical probing module 310 with the internal apparatus 200 of the plasma chamber. The external optical guide 320 may form an external path of light outside the plasma chamber. In particular, the external optical guide 320 may connect the polarization controller 318 of the optical probing module 310 with the internal apparatus 200 of the plasma chamber. For example, the external optical guide 320 may be connected to the internal optical guide 220 of the internal apparatus 200 in the plasma chamber. In example embodiments, the external optical guide 320 may include an optical fiber, as an example.

The external optical connector 340 may be installed at an outer wall of the plasma chamber. The external optical guide 320 may be connected to the external optical connector 340. The external optical connector 340 may be detachably connected to the internal optical connector 240. Thus, the optical measurement module 300 may be selectively connected with the internal apparatus 200 of the plasma chamber by the connection between the internal optical connector 240 and the external optical connector 340. In some implementations, the internal optical connector 240 and the external optical connector 340 may include a single optical connector.

The signal-processing module 330 may receive the information of the light detected by the detector 316. The signal-processing module 330 may convert an optical signal of the light detected by the detector 316 into an electrical signal.

The signal-processing module 330 may include a filter 332 and an amplifier 334. The filter 332 may remove noises from the detected light. The amplifier 334 may amplify the light without the noises.

The control module 350 may receive the electrical signal converted by the signal-processing module 330. Further, the control module 350 may receive the polarization characteristic of the light controlled by the polarization controller 318. The polarization characteristic of the light controlled by the polarization controller 318 may be converted into the electrical signal. The electrical signal may then be transmitted to the control module 350. The control module 350 may measure the change of the optical characteristic of the detected light based on the received electrical signal. As mentioned above, the change of the optical characteristic in the light measured by the control module may correlate with the density of the plasma in the plasma chamber. Particularly, when a plurality of the EO sensor module 210 are arranged in the plasma chamber, changes of the optical characteristics in the lights measured by the control module 350 may also represent a distribution of a plasma density.

Further, the control module 350 may store data such as the electrical signal of the detected light. In particular, when a plurality of the EO sensor modules 210 are arranged in a plurality of the plasma chambers, the control module 350 may perform a control function for reducing a distribution change between the plasma processes performed by the plasma apparatuses using the data provided from the EO sensor modules 210.

In example embodiments, the operations of the internal apparatus 200 in the plasma chamber and the optical measurement module 300 may be performed in the plasma process in real time. That is, the monitoring apparatus 100 of example embodiments may perform the monitoring process in real time during the plasma process.

The power source 360 may supply a power to the optical probing module 310, the signal-processing module 330 and the control module 350.

Figure 2:
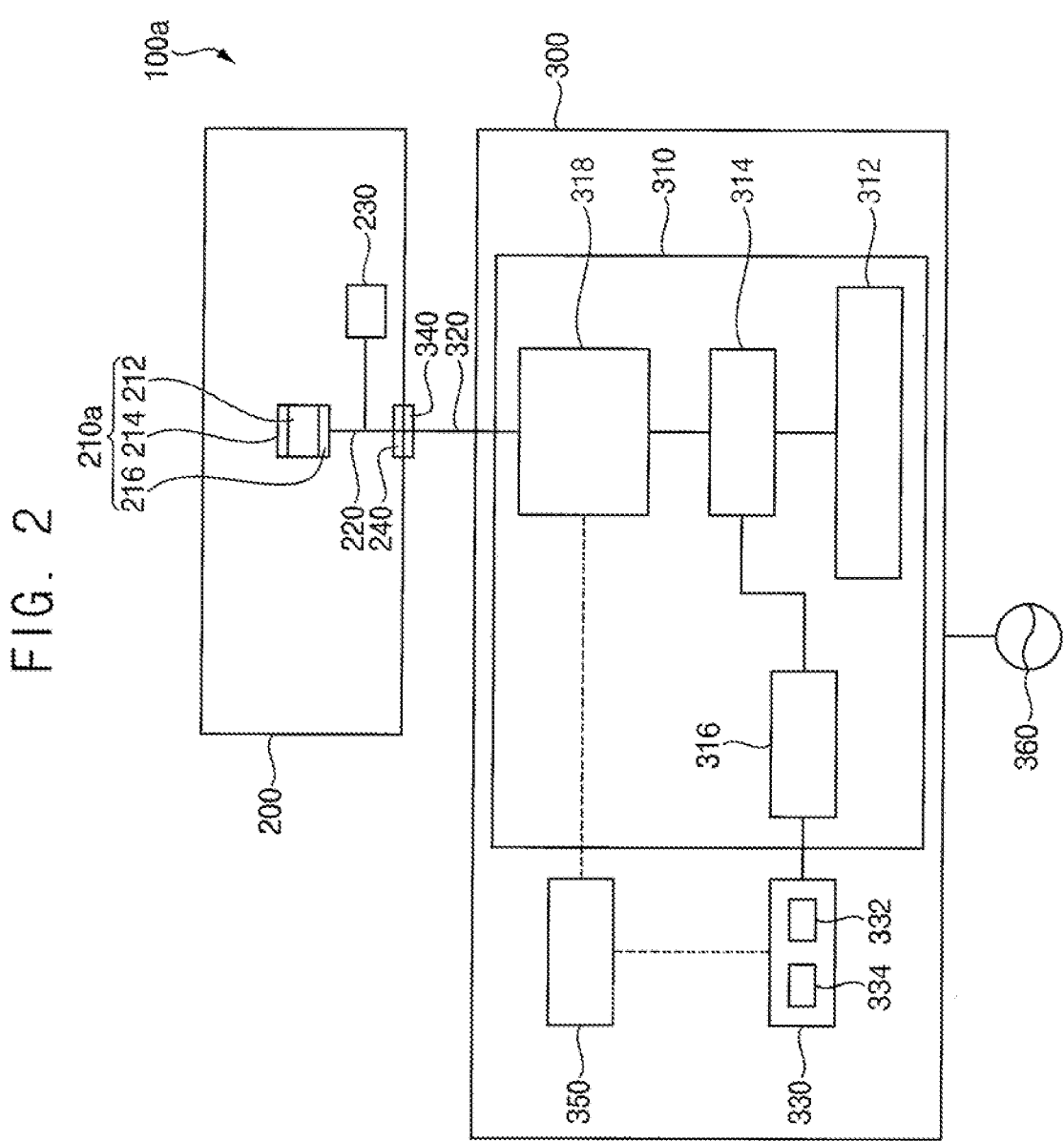
FIG. 2 is a block diagram illustrating with more detail an apparatus for monitoring a plasma process in accordance with example embodiments.

FIG. 2 is a block diagram illustrating an apparatus for monitoring a plasma process in accordance with an example embodiment.

A monitoring apparatus 100a of this example embodiment may include elements that are substantially the same as those of the monitoring apparatus 100 in FIG. 1, except for further including an auxiliary reflector. Thus, the same reference numerals may refer to the same elements and any further illustrations with respect to the same elements may be omitted herein for brevity.

Referring to FIG. 2, an EO sensor module 210a may further include an auxiliary reflector 216. The auxiliary reflector 216 may be arranged at the first surface of the EO sensor 212 to which light may be incident. Thus, the auxiliary reflector 216 and the reflector 214 may face each other along an incident direction of the light.

The auxiliary reflector 216 may reflect the light reflected from the reflector 216 toward the reflector 214. Thus, the light may be reciprocally moved between the reflector 214 and the auxiliary reflector 216. However, because the light may be transmitted to the internal optical guide 220 through the auxiliary reflector 216, a reflectivity of the auxiliary reflector 216 may be lower than the reflectivity of the reflector 214.

Light finally passing through the auxiliary reflector 216 may have more accurate optical characteristics due to the changed optical refractive index.

Figure 3:
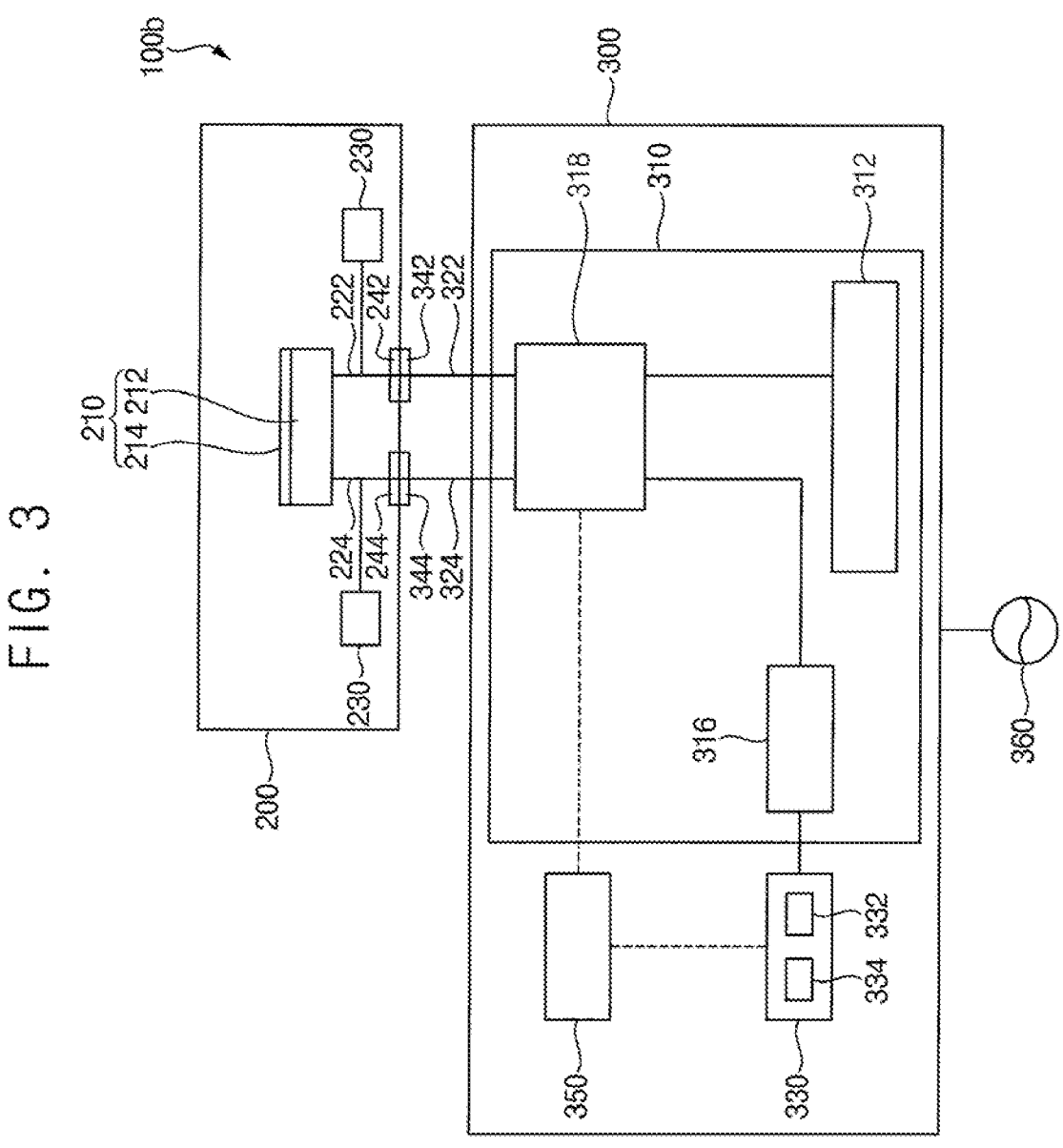
FIG. 3 is a block diagram illustrating with still more detail an apparatus for monitoring a plasma process in accordance with example embodiments.

FIG. 3 is a block diagram illustrating an apparatus for monitoring a plasma process in accordance with example embodiments.

A monitoring apparatus 100b of this example embodiment may include elements substantially the same as those of the monitoring apparatus 100 in FIG. 1 except with respect to an optical guide. Thus, the same reference numerals may refer to the same elements and any further illustrations with respect to the same elements may be omitted herein for brevity.

Referring to FIG. 3, an internal optical guide may include a first internal optical guide 222 and a second internal optical guide 224. The first internal optical guide 222 may form an internal incident path of light. The second internal optical guide 224 may also form an internal reflection path of light.

An external optical guide may include a first external optical guide 322 and a second external optical guide 324. The first external optical guide 322 may form an external incident path of the light. The second external optical guide 324 may form an external reflection path of the light.

Thus, the first external optical guide 322 may be connected to the first internal optical guide 222. The first external optical guide 322 and the first internal optical guide 222 may be selectively connected with each other via first internal and external optical connectors 242 and 342. The second external optical guide 324 may be connected to the second internal optical guide 224. The second external optical guide 324 and the first external optical guide 224 may be selectively connected with each other via second internal and external optical connectors 244 and 344.

Light generated from the light source 312 may be incident to the EO sensor 212 through the first external optical guide 322 and the first internal optical guide 222. The light reflected from the reflector 214 may be transmitted to the polarization controller 318 through the second internal optical guide 224 and the second external optical guide 324.

The incident light may be transmitted through the first external optical guide 322 and the first internal optical guide 222, and the reflected light may be transmitted through the second internal optical guide 224 and the second external optical guide 324. Thus, it may not be necessary to branch light into incident light and reflected light. As a result, the monitoring apparatus 100b of this example embodiment need not include a circulator.

In example embodiments, the monitoring apparatuses 100 in FIG. 1, 100a in FIGS. 2 and 100b in FIG. 3 include the optical connector. However, when the internal apparatus 200 of the plasma chamber is integrally formed with the optical measurement module 300, the monitoring apparatuses 100, 100a and 100b need not include the optical connector.

Figure 4:
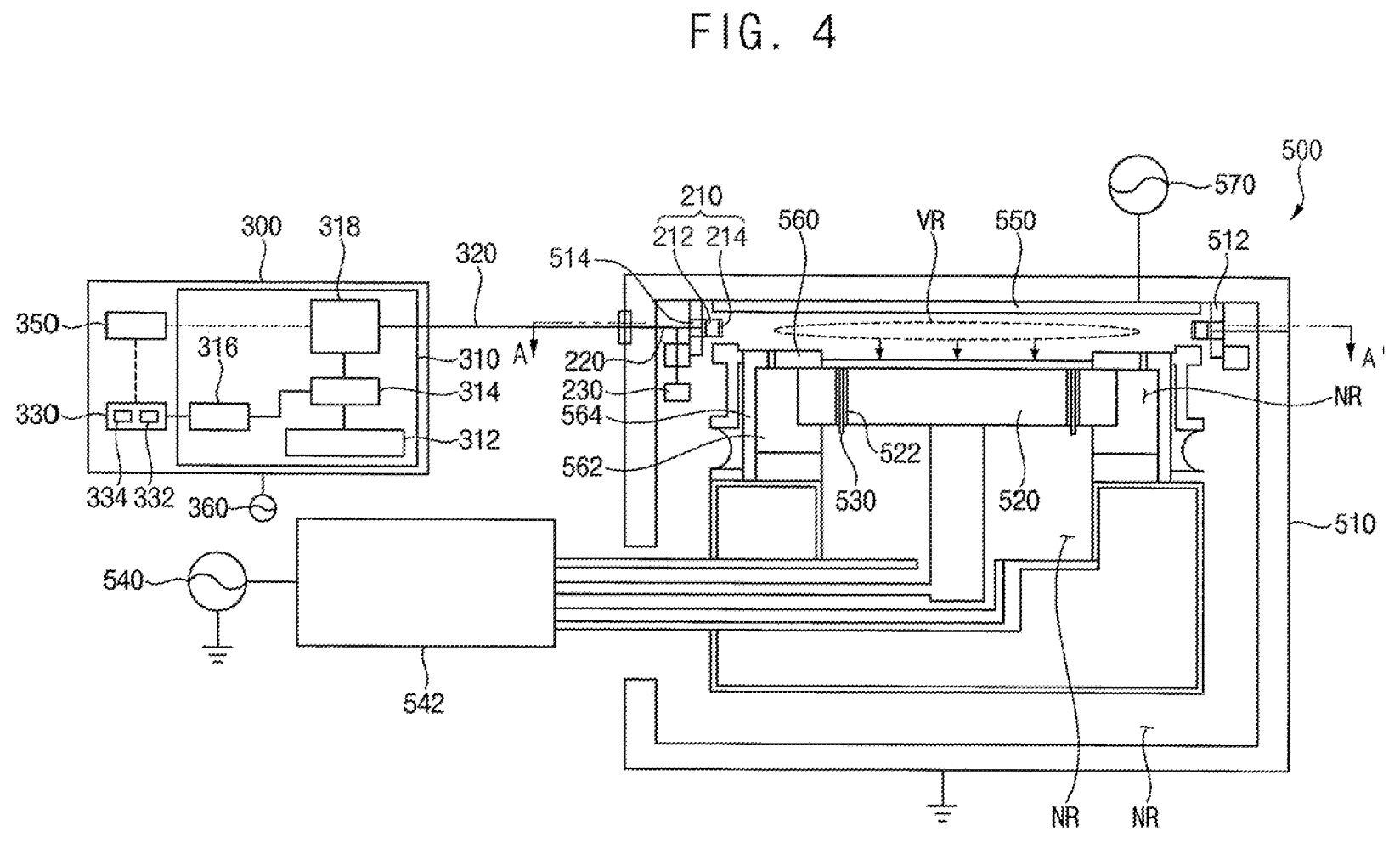
Figure 5:
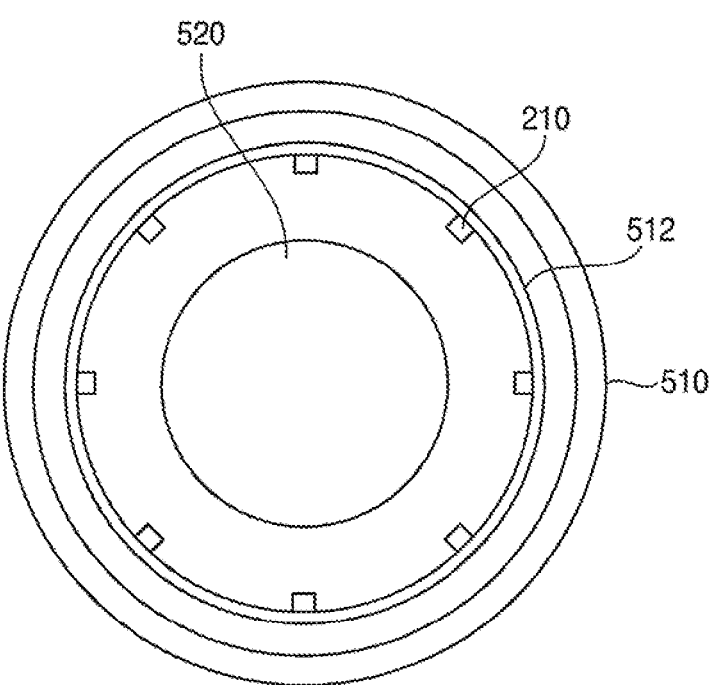
FIG. 5 is a cross-sectional view taken along a line A-A' in FIG. 4.

FIG. 4 is a cross-sectional view illustrating a CCP apparatus with the monitoring apparatus in FIG. 1 in accordance with example embodiments, and FIG. 5 is a cross-sectional view taken along a line A-A' in FIG. 4.

Referring to FIGS. 4 and 5, a plasma apparatus according to example embodiments may include a capacitively coupled plasma (CCP) apparatus 500. The CCP apparatus 500 may apply a radio frequency (RF) power to opposite electrodes to generate plasma from a process gas using an RF electric field between the electrodes. The CCP apparatus 500 may include various semiconductor fabrication apparatuses configured to process a substrate in a plasma chamber using the plasma such as a deposition apparatus, an etching apparatus, an ashing apparatus, etc. The CCP apparatus 500 may include a plasma chamber 510, a showerhead 550, an electrostatic chuck (ESC) 520, a plurality of lift pins 530, an edge ring 560 and the monitoring apparatus 100.

The monitoring apparatus 100 may include elements in FIG. 1. Thus, any further illustrations with respect to the monitoring apparatus 100 may be omitted herein for brevity. Alternatively, the plasma apparatus 500 may include the monitoring apparatus 100a in FIG. 2 or the monitoring apparatus 100b in FIG. 3.

The plasma chamber 510 may have an inner space configured to receive a semiconductor substrate. The plasma chamber 510 may have a vacuum region VR for defining a space where the plasma may be formed and a non-vacuum region NR configured to surround the vacuum region VR. The vacuum region VR may have a side surface defined by a vacuum wall 512 downwardly extending from an upper surface of the plasma chamber 510. The non-vacuum region NR may correspond to a remaining region of the plasma chamber 510 except for the vacuum region VR. For example, the non-vacuum region NR may include a portion having a dielectric material in the plasma chamber 510, an empty space in the plasma chamber 510 under the ESC 520, etc.

The showerhead 550 may be arranged at an upper region in the plasma chamber 510. The showerhead 550 may include a plurality of injection holes configured to inject the process gas into the plasma chamber 510. An RF power 570 may be electrically connected to the showerhead 550. Thus, the showerhead 550 may act as an upper electrode.

The electrostatic chuck (ESC) 520 may be arranged at a lower region in the plasma chamber 510. RF power 540 may electrically connected to the ESC 520. Thus, the ESC 520 may act as a lower electrode. A matcher 542 may be arranged between the RF power 540 and the ESC 520. A plurality of lift holes 522 may be vertically formed through the ESC 520. As shown in an arrow direction of FIG. 4, the electric field formed in the plasma chamber 510 may be applied to an upper surface of the ESC 520 from the showerhead 550.

The lift pins 530 may be movably inserted into the lift holes 522 of the ESC 520. The lift pins 530 may support the semiconductor substrate. The lift pins 530 may be moved downwardly together with the semiconductor substrate to place the semiconductor substrate on the upper surface of the ESC 520. Further, the lift pins 530 may be upwardly moved together with the semiconductor substrate on which the plasma process may be performed.

The edge ring 560 may be arranged around an upper edge portion of the ESC 520 to surround the semiconductor substrate. The edge ring 560 may protect an outer circumferential surface of the semiconductor substrate from the plasma. Further, the edge ring 560 may concentrate the plasma on an upper surface of the semiconductor substrate. When the CCP apparatus 500 includes the etching apparatus, the edge ring 560 may be partially etched by the plasma.

An insulator 562 may be arranged under the edge ring 560. The insulator 562 may be configured to surround the side surface and an edge portion of a lower surface in the ESC 520. Further, the insulator 562 may have an upper surface configured to make contact with the lower surface of the edge ring 560.

A quartz ring 564 may be arranged between the insulator 562 and an inner surface of the plasma chamber 510. Further, the quartz ring 564 may include a portion configured to enter between the edge ring 560 and the inner surface of the plasma chamber 510.

When the plasma apparatus is the CCP apparatus 500, the EO sensor module 210 may be arranged in the vacuum region VR of the plasma chamber 510. The EO sensor module 210 may enter into the vacuum region VR of the plasma chamber 510 through a viewport 514 installed at the vacuum wall 512. Further, a plurality of the EO sensor modules 210 may be arranged along an inner surface of the vacuum wall 512 by a uniform gap.

When the EO sensor module 210 is positioned in the vacuum region VR where the plasma is formed, the electric field in the plasma chamber 510 may be directly applied to the EO sensor module 210. When the EO sensor module 210 is positioned in the vacuum region VR corresponding to the plasma formation space, as mentioned above, the EO sensor module 210 may include the non-conductive material so that the EO sensor module 210 will not act as the noise for generating the electrical arcing, for distorting the plasma, etc.

The optical refractive index of the EO sensor 212 may be altered by a change in the electric field in the plasma chamber 510. When light generated from the light source 312 is incident to the EO sensor 212, the optical characteristic of the light may be altered by changes in the optical refractive index.

Light having a changed optical characteristic may be reflected from the reflector 214. The polarization controller 318 may control the polarization characteristic of the light. The circulator 314 may branch the light into incident light and reflected light.

The detector 316 may detect the light that is branched by the circulator 314. Because the light detected by the detector 316 may have changed optical characteristics, the light may include information regarding the plasma density.

The signal-processing module 330 may convert the optical signal of the detected light into an electrical signal. The filter 332 may remove noise from the detected light. The amplifier 334 may amplify the light without the noise.

The control module 350 may receive the electrical signal of the light converted by the signal-processing module 330. The control module 350 may measure the optical characteristic change of the detected light from the received electrical signal. In particular, the control module 350 may measure the optical characteristic of the light in real time while the plasma process is being performed. That is, the control module 350 may monitor plasma in real time during the plasma process.

As mentioned above, the optical characteristic change of the light measured by the control module 350 may correlate with the plasma density in the vacuum region VR where the EO sensor module 210 is positioned. Further, the optical characteristic changes of the light measured by the control module 350 may correlate with plasma densities in the vacuum region VR where the EO sensor modules 210 are positioned. Thus, a distribution of the plasma density in the plasma chamber 510 may be predicted from the optical characteristic changes of the light. A correlation between the optical characteristic change of the light and the plasma density may be obtained by modeling intensity changes of the electric field in accordance with the plasma density, the changes of the optical refractive index in the EO sensor 212, and the optical characteristic change of the light.

Figure 6:
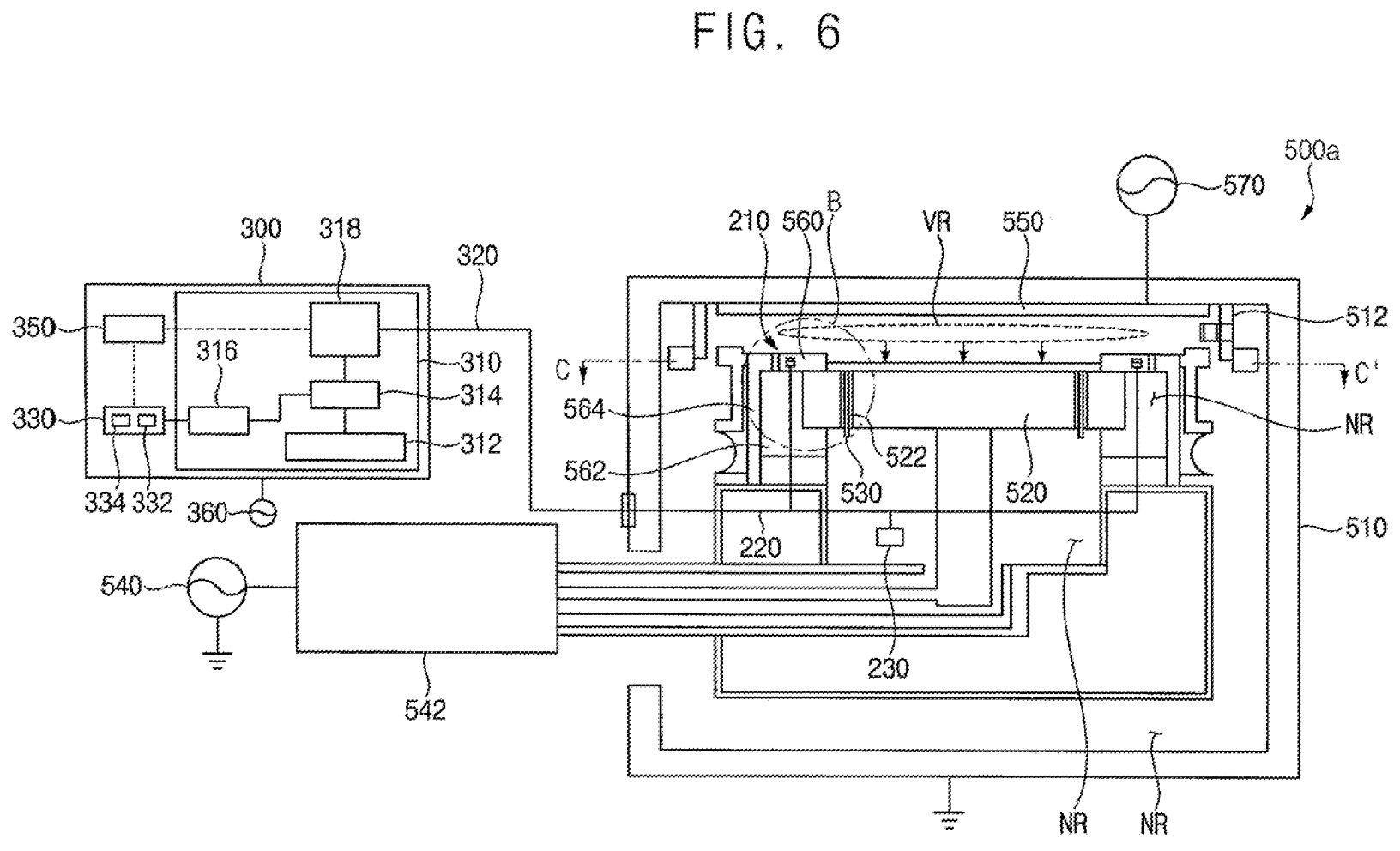
Figure 7:
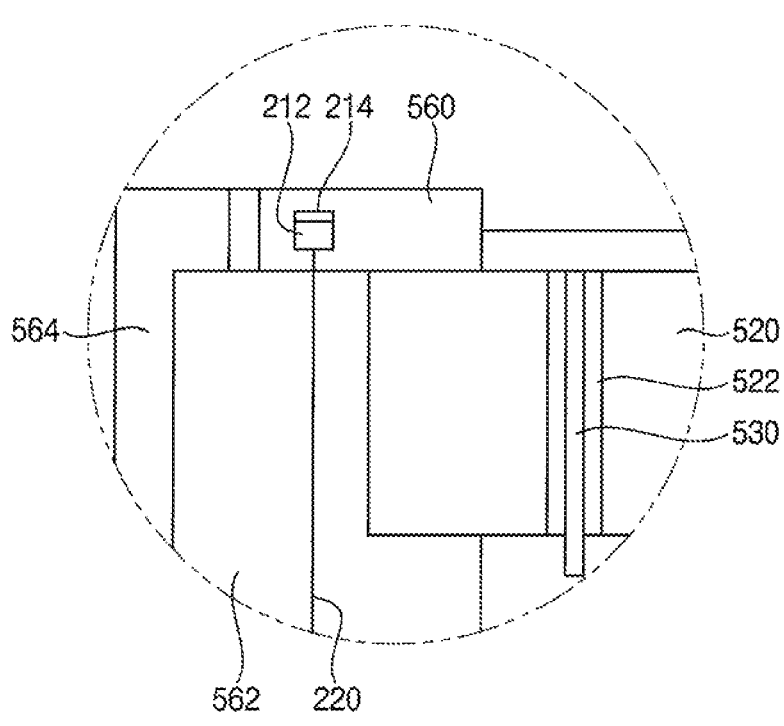
FIG. 7 is an enlarged cross-sectional view of a portion "B" in FIG. 6.

FIG. 6 is a cross-sectional view illustrating a CCP apparatus with the monitoring apparatus in FIG. 1 in accordance with example embodiments. FIG. 7 is an enlarged cross-sectional view of a portion "B" in FIG. 6 and FIG. 8 is a cross-sectional view taken along a line C-C' in FIG. 6.

A CCP apparatus 500a according to this example embodiment may include elements that are substantially the same as those of the CCP apparatus 500 in FIG. 4 except for the position of the EO sensor module. Thus, the same reference numerals may refer to the same elements and any further illustrations with respect to the same elements may be omitted herein for brevity.

Figure 8:
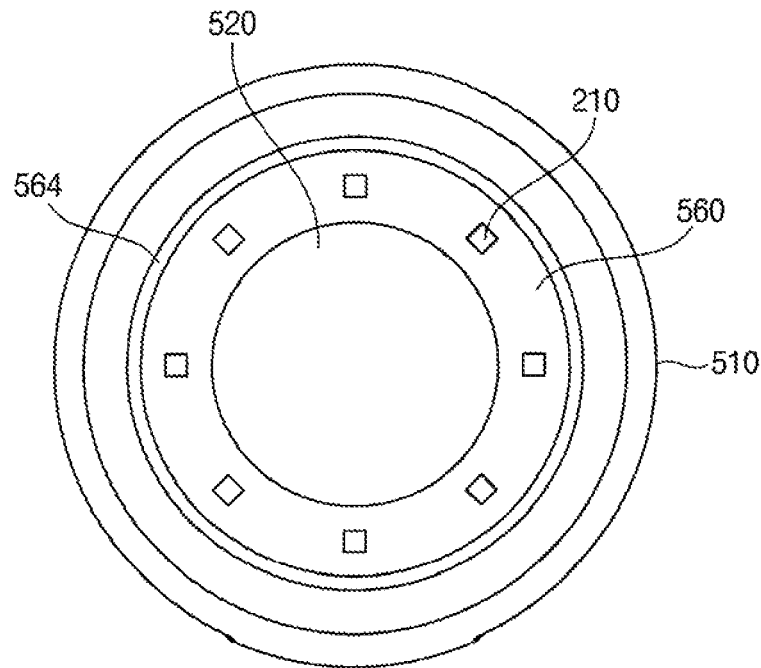
FIG. 8 is a cross-sectional view taken along a line C-C' in FIG. 6.

Referring to FIGS. 6 to 8, the EO sensor module 210 may be arranged in the non-vacuum region NR of the plasma chamber 510. In particular, the EO sensor module 210 may be arranged at the portion including the dielectric material in the non-vacuum region NR.

In example embodiments, the EO sensor module 210 may be arranged in the edge ring 560. In particular, the EO sensor modules 210 may be arranged in the edge ring 560 by a uniform gap.

When the electric field in the plasma chamber 510 is applied to the edge ring 560, the electric field may change the optical refractive indexes of the EO sensors 212 in the edge ring 560. The optical characteristics of light incident to the EO sensor modules 210 may be changed due to the changed optical refractive indexes. Thus, optical characteristic changes of light measured by the control module 350 may correlate with a plasma density and a distribution of the plasma density at regions adjacent to the edge ring 560 where the EO sensor modules 210 are positioned.

Figure 9:
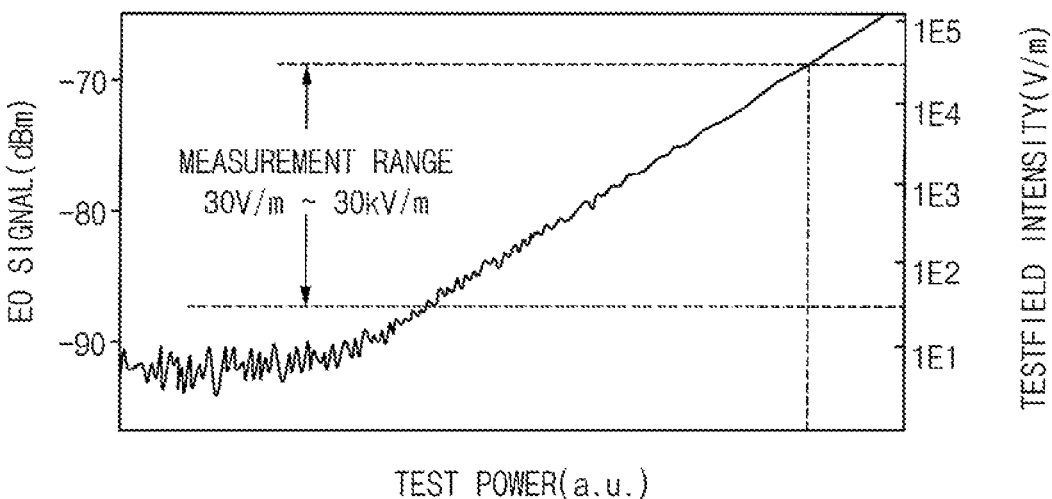
FIG. 9 is a graph showing an electric field applied to a measured edge ring.
Figure 10:
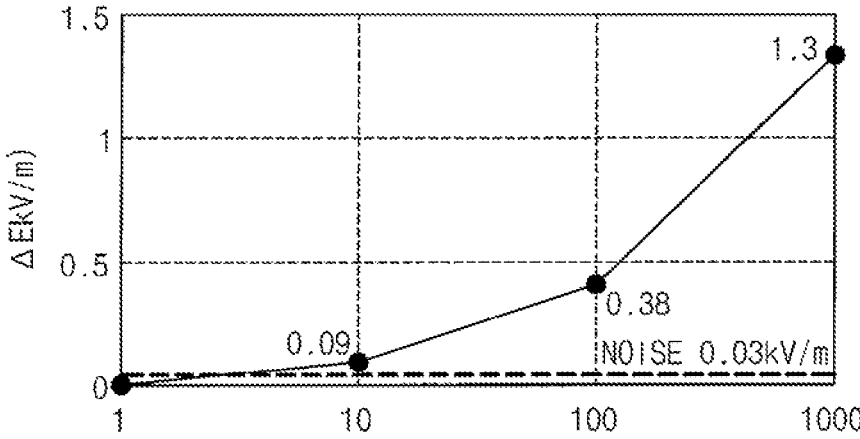
FIG. 10 is a graph showing a change of an electric field at an edge region of a plasma chamber in accordance with etched thicknesses of an edge ring.

FIG. 9 is a graph showing an electric field applied to a measured edge ring and FIG. 10 is a graph showing a change of an electric field at an edge region of a plasma chamber in accordance with etched thicknesses of an edge ring.

In FIG. 9, the horizontal axis indicates power, the right vertical axis indicates an intensity of the electric field. The left vertical axis indicates an output value of the EO sensor. As shown in FIG. 9, it can be seen that the intensity of power in the plasma chamber 510 may increase in proportion to an increase in the power applied to the plasma chamber 510. Further, it can be noted that the output value of the EO sensor 212 may also increase in proportion to the increase in the intensity of the electric field.

In FIG. 10, the horizontal axis indicates an etched thickness of the edge ring and the vertical axis indicates changes in the electric field. As shown in FIG. 10, it can be noted that the changes to the electric field at an edge region in the plasma chamber 510 may increase in proportion to an increase in the etched thickness of the edge ring.

Therefore, it can be determined that the EO sensor module 210 according to example embodiments can measure the electric field of plasma. As a result, the distribution of the plasma density may be obtained using the EO sensor module 210.

Figure 11:
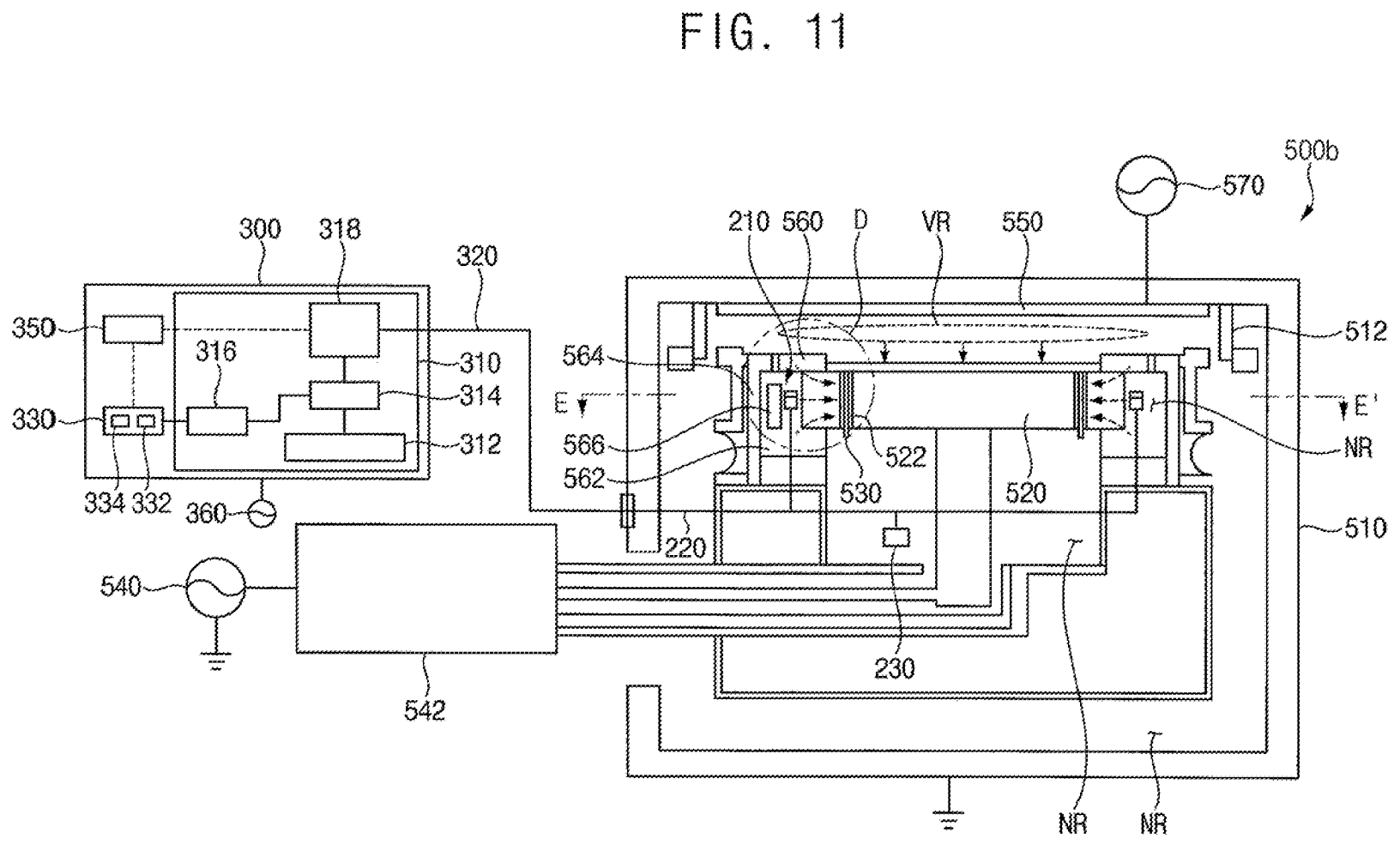
Figure 12:
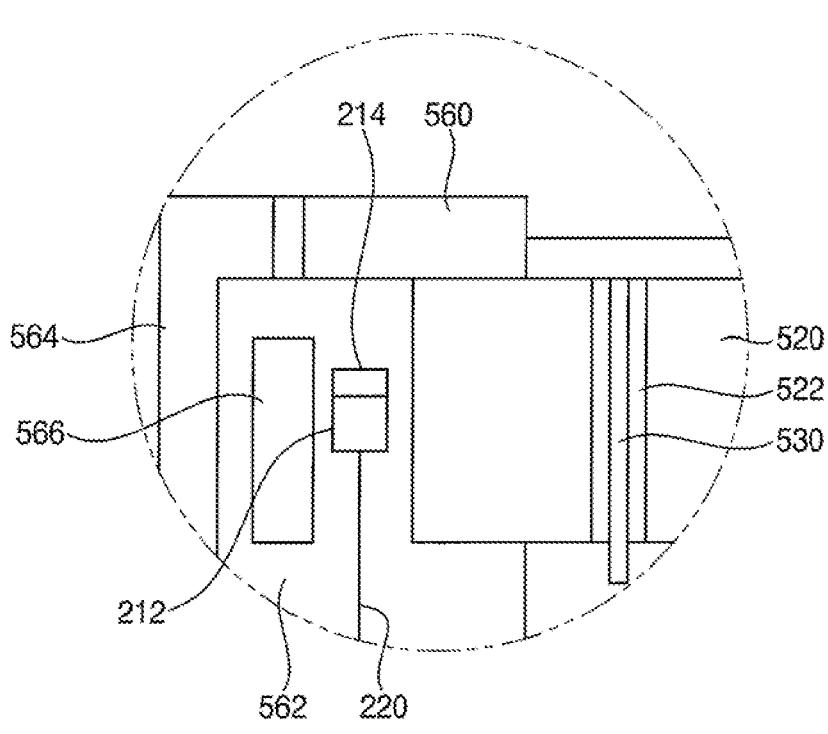
FIG. 12 is an enlarged cross-sectional view of a portion "D" in FIG. 11.

FIG. 11 is a cross-sectional view illustrating a CCP apparatus including the monitoring apparatus in FIG. 1 in accordance with example embodiments. FIG. 12 is an enlarged cross-sectional view of a portion "D" in FIG. 11 and FIG. 13 is a cross-sectional view taken along a line E-E' in FIG. 11.

A CCP apparatus 500b of this example embodiment may include elements that are substantially the same as those of the CCP apparatus 500 in FIG. 4 except for a position of the EO sensor module. Thus, the same reference numerals may refer to the same elements and any further illustrations with respect to the same elements may be omitted herein for brevity.

Figure 13:
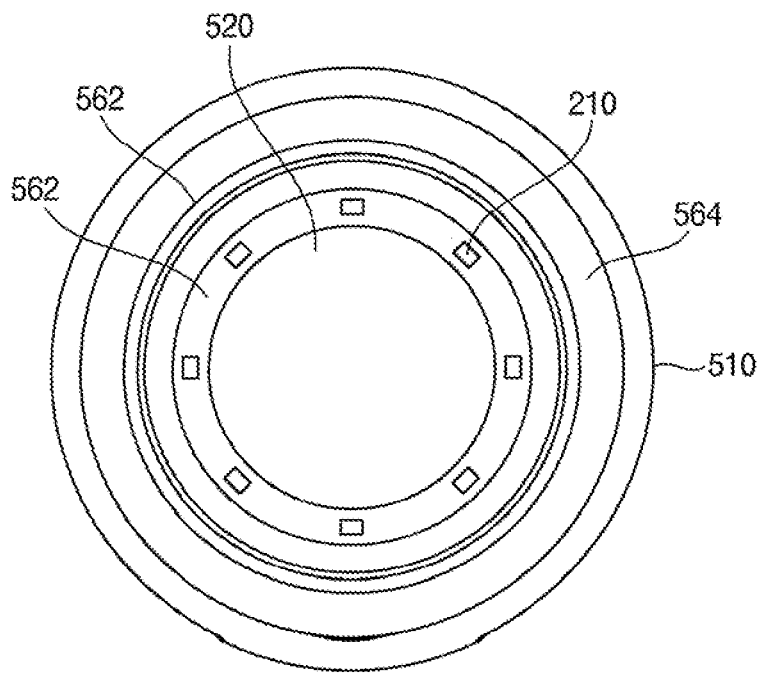
FIG. 13 is a cross-sectional view taken along a line E-E' in FIG. 11.

Referring to FIGS. 11 to 13, the CCP apparatus 500b of example embodiments may further include an electron beam induced current (EBIC) ring 566. The EBIC ring 566 may be arranged in the insulator 562. The EBIC ring 566 may induce the electric field to the edge ring 560 to increase the plasma density in an edge upper region of the semiconductor substrate. Thus, the EBIC ring 566 may be electrically connected to an RF power. Therefore, the electric field in the plasma chamber 510 may be applied to the side surface of the ESC 520 as well as the upper surface of the ESC 520 from the showerhead 550.

In example embodiments, the EO sensor module 210 may be arranged between the EBIC ring 566 and the ESC 520. In particular, the plurality of the EO sensor modules 210 may be arranged in the insulator 562 between the EBIC ring 566 and the ESC 520. In addition, the EO sensor modules 210 may be arranged in the insulator 562 between the EBIC ring 566 and the ESC 520 by a uniform gap.

When the electric field in the plasma chamber 510 is applied to the insulator 562 between the EBIC ring 566 and the ESC 520, the electric field may alter the optical refractive indexes of the EO sensors 212 in the insulator 562. The optical characteristics of the light incident to the EO sensor modules 210 may be changed by the changes in the optical refractive indexes. Thus, optical characteristic changes in the light measured by the control module 350 may correlate with changes in a plasma density and a distribution of the plasma density at regions adjacent to the insulator 562 between the EBIC ring 566 and the ESC 520 where the EO sensor modules 210 are positioned.

Figure 14:
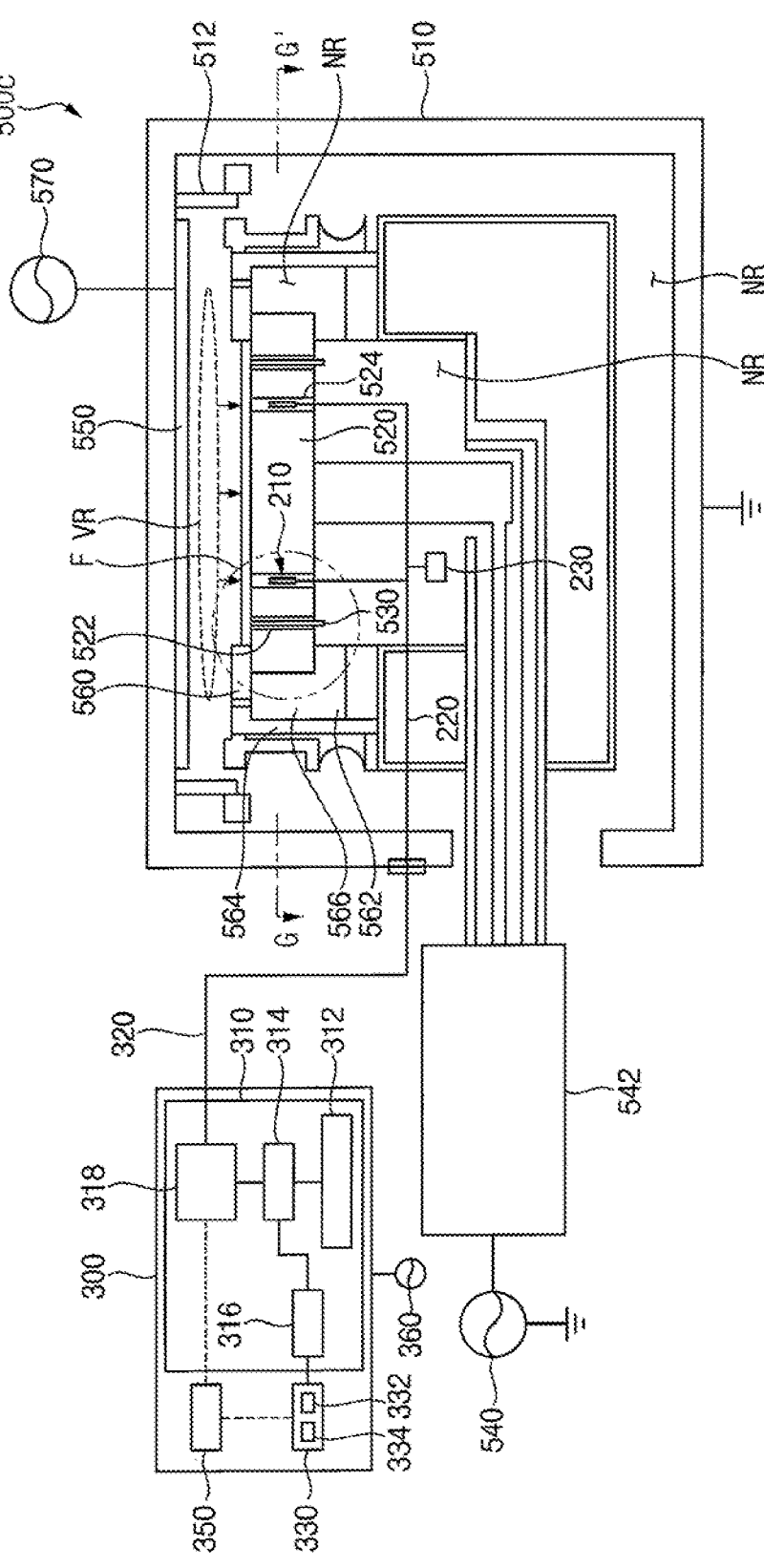
FIG. 14 is a cross-sectional view illustrating a CCP apparatus with the monitoring apparatus in FIG. 1 in accordance with example embodiments.
Figure 15:
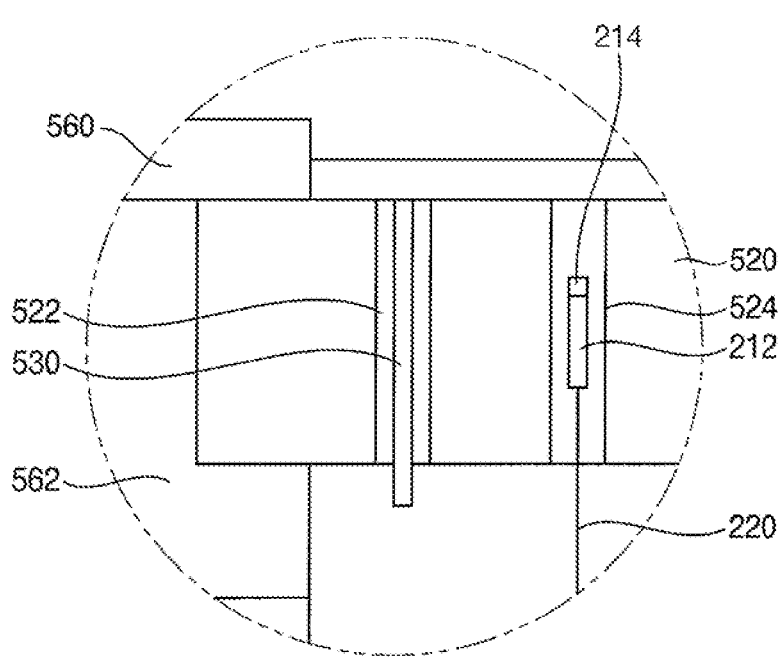
FIG. 15 is an enlarged cross-sectional view of a portion "F" in FIG. 14.
Figure 16:
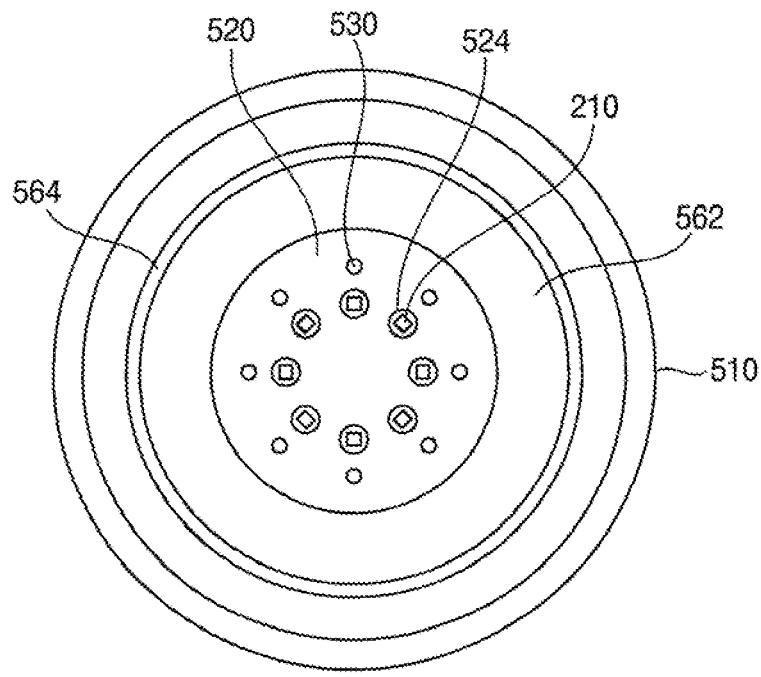
FIG. 16 is a cross-sectional view taken along a line G-G' in FIG. 14.

FIG. 14 is a cross-sectional view illustrating a CCP apparatus including the monitoring apparatus in FIG. 1 in accordance with example embodiments, FIG. 15 is an enlarged cross-sectional view of a portion "F" in FIG. 14, and FIG. 16 is a cross-sectional view taken along a line G-G' in FIG. 14.

A CCP apparatus 500c according to the example embodiments as illustrated in FIGS. 11 to 13 may include elements that are substantially the same as those of the CCP apparatus 500 in FIG. 4 except for a position of the EO sensor module. Thus, the same reference numerals may refer to the same elements and any further illustrations with respect to the same elements may be omitted herein for brevity.

Referring to FIGS. 14 to 16, the EO sensor module 210 may be arranged in at least one sensing hole 524 formed through the ESC 520. The sensing hole 524 may be formed together with a process for forming the lift holes 522, which may allow the lift pins 530 to pass therethrough, through the ESC 520.

In example embodiments, a plurality of the sensing holes 524 may be arranged along a circumferential line of the ESC 520 separated by a uniform gap. In addition, the sensing hole 524 may be arranged at a central portion of the ESC 520. The plurality of the EO sensor modules 210 may be arranged in the plurality of the sensing holes 524.

The electric field in the plasma chamber 510 may alter the optical refractive indexes of the EO sensors 212 in the sensing holes 524 of the ESC 520. The optical characteristics of the light incident to the EO sensor modules 210 may be changed by the changed optical refractive indexes. Thus, optical characteristic changes of the light measured by the control module 350 may correlate with a plasma density and a distribution of the plasma density at regions adjacent to the sensing holes 524 where the EO sensor modules 210 are positioned.

Figure 17:
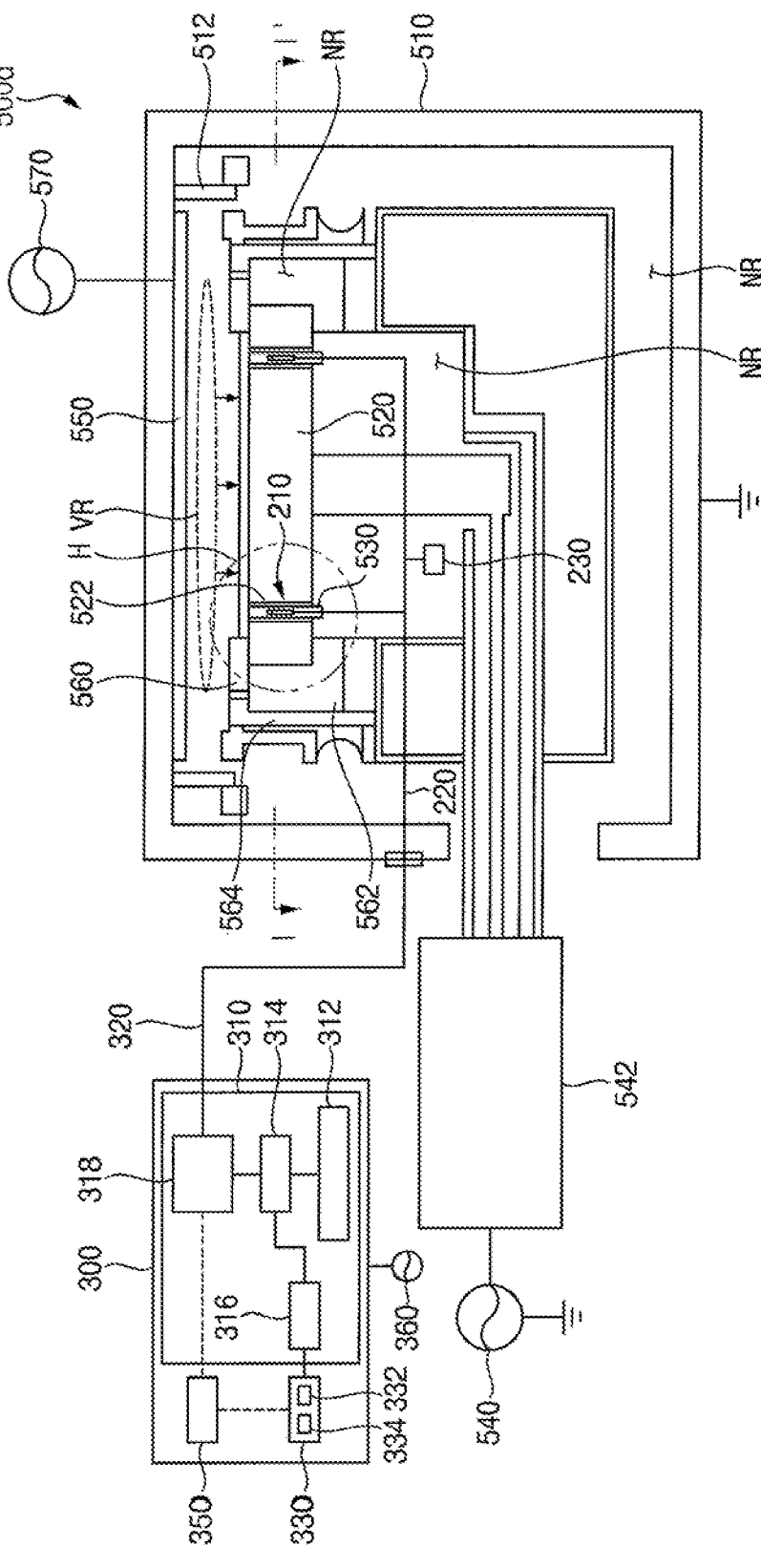
FIG. 17 is a cross-sectional view illustrating a CCP apparatus with the monitoring apparatus in FIG. 1 in accordance with example embodiments.
Figure 18:
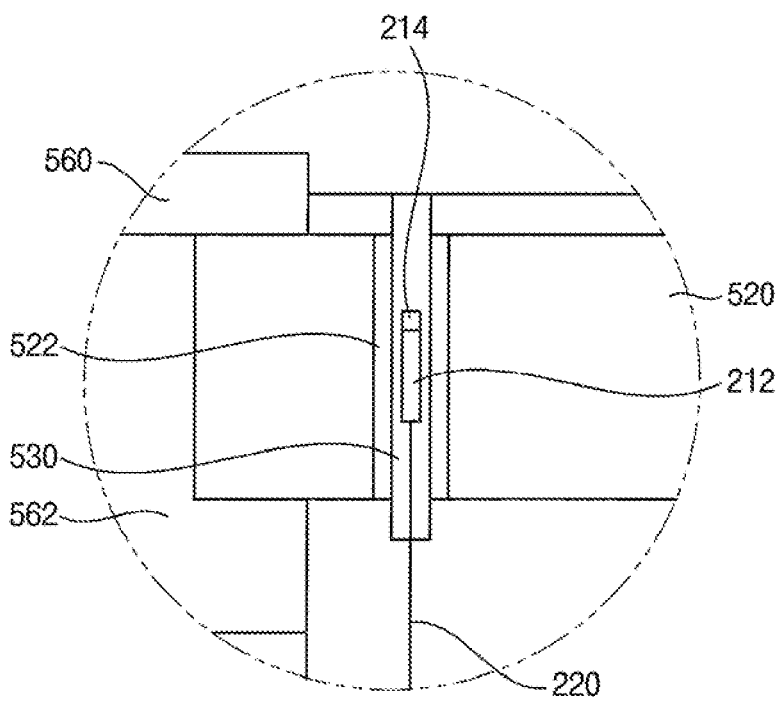
FIG. 18 is an enlarged cross-sectional view of a portion "H" in FIG. 17.
Figure 19:
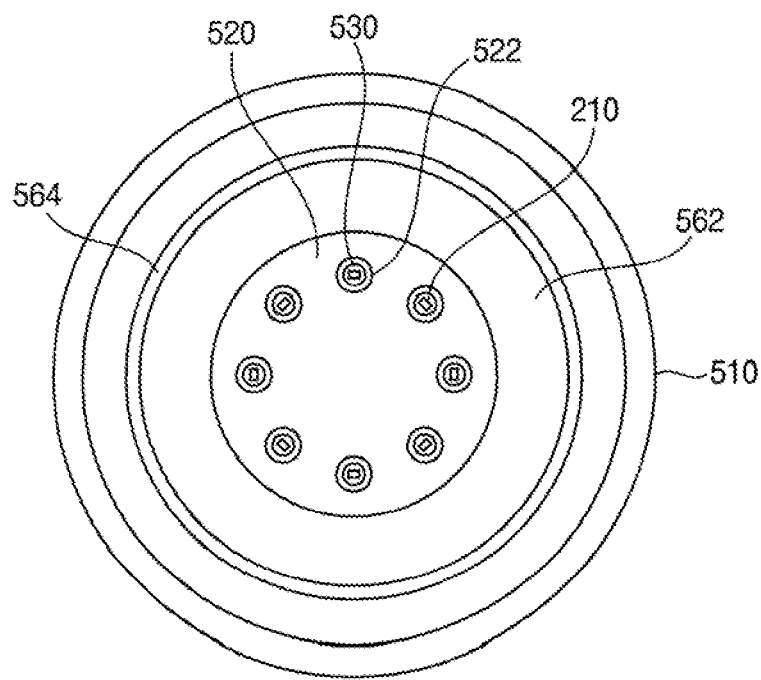
FIG. 19 is a cross-sectional view taken along a line I-I' in FIG. 17.

FIG. 17 is a cross-sectional view illustrating a CCP apparatus including the monitoring apparatus in FIG. 1 in accordance with example embodiments, FIG. 18 is an enlarged cross-sectional view of a portion "H" in FIG. 17 and FIG. 19 is a cross-sectional view taken along a line I-I' in FIG. 17.

A CCP apparatus 500d of this example embodiment may include elements that are substantially the same as those of the CCP apparatus 500 in FIG. 4, except for the position of the EO sensor module. Thus, the same reference numerals may refer to the same elements and any further illustrations with respect to the same elements may be omitted herein for brevity.

Referring to FIGS. 17 to 19, the EO sensor modules 210 may be arranged in the lift pins 530 in the lift holes 522 of the ESC 520. For example, the EO sensor modules 210 may move together with the lift pins 530.

The electric field in the plasma chamber 510 may alter the optical refractive indexes of the EO sensors 212 in the lift pins 530. The optical characteristics of light incident to the EO sensor modules 210 may change according to the changed optical refractive indexes. Thus, optical characteristic changes of the light measured by the control module 350 may correlate with a plasma density and a distribution of the plasma density at regions adjacent to the lift pins 530 where the EO sensor modules 210 are positioned.

Figure 20:
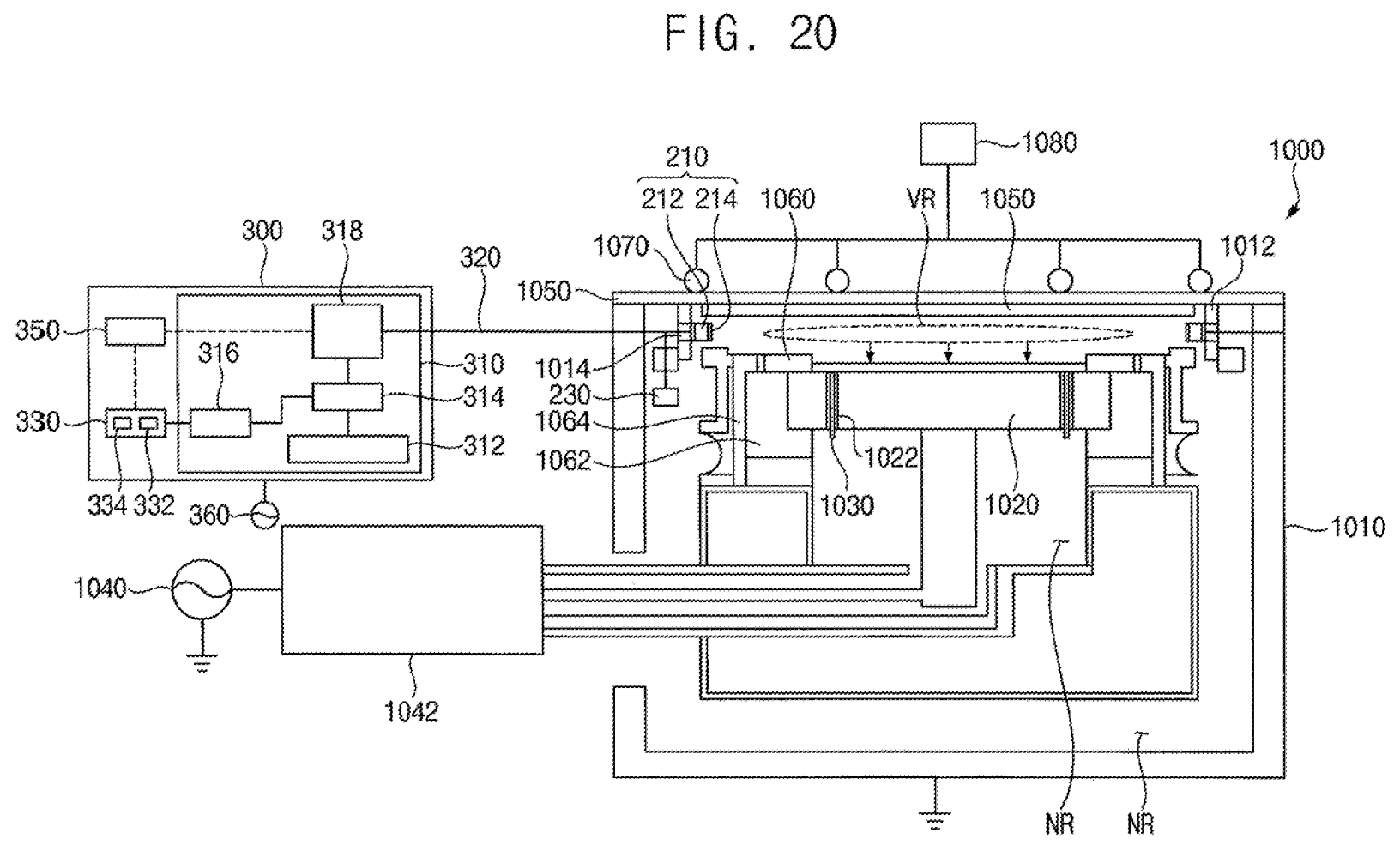

FIG. 20 is a cross-sectional view illustrating an ICP apparatus with the monitoring apparatus in FIG. 1 in accordance with example embodiments.

Referring to FIG. 20, a plasma apparatus according to example embodiments may include an inductively coupled plasma (ICP) apparatus 1000. The ICP apparatus 1000 may generate plasma from a process gas using a magnetic field induced by a coil type antenna 1070. An RF power applied to the coil type antenna 1070 may be transmitted to the process gas through a dielectric window 1050. The ICP apparatus 1000 may include various semiconductor fabrication apparatuses configured to process a substrate in a plasma chamber such as a deposition apparatus, an etching apparatus, an ashing apparatus, etc., using the plasma. The ICP apparatus 1000 may include a plasma chamber 1010, the antenna 1070, the dielectric window 1050, an ESC 1020, a plurality of lift pins 1030, an edge ring 560 and the monitoring apparatus 100.

The monitoring apparatus 100 may include elements in FIG. 1. Thus, further illustrations with respect to the monitoring apparatus 100 may be omitted herein for brevity. In some implementations, the plasma apparatus 1000 may include the monitoring apparatus 100a in FIG. 2 or the monitoring apparatus 100b in FIG. 3.

The plasma chamber 1010 may include an inner space configured to receive a semiconductor substrate. The plasma chamber 1010 may include a vacuum region VR for defining a space where plasma is formed and a non-vacuum region NR configured to surround the vacuum region VR. The vacuum region VR may have a side surface defined by a vacuum wall 1012 that extends downwardly from an upper surface of the plasma chamber 1010.

The antenna 1070 may be arranged at an upper region in the plasma chamber 1010. An RF power 1080 may be electrically connected to the antenna 1070. The magnetic field induced by the antenna 1070 may be applied to process gas injected into the plasma chamber 1010 to generate the plasma.

The dielectric window 1050 may be arranged under the antenna 1070. The dielectric window 1050 may include a dielectric material. The dielectric window 1050 may function to transmit the RF power supplied to the antenna 1070 into the plasma chamber 1010. Further, the dielectric window 1050 may function to inject the process gas into the plasma chamber 1010.

The ESC 1020 may be arranged at a lower region in the plasma chamber 1010. RF power 1040 may electrically connected to the ESC 1020. A matcher 1042 may be arranged between the RF power 1040 and the ESC 1020. A plurality of lift holes 1022 may be vertically formed through the ESC 1020.

The lift pins 1030 may be movably inserted into the lift holes 1022 of the ESC 1020. The lift pins 1030 may support the semiconductor substrate. The lift pins 1030 may be downwardly moved together with the semiconductor substrate to place the semiconductor substrate on the upper surface of the ESC 1020. The lift pins 1030 may be upwardly moved together with the semiconductor substrate on which the plasma process is to be performed.

The edge ring 1060 may be arranged around an upper edge portion of the ESC 1020 to surround the semiconductor substrate. The edge ring 1060 may protect an outer circumferential surface of the semiconductor substrate from the plasma. Further, the edge ring 1060 may concentrate the plasma on an upper surface of the semiconductor substrate.

An insulator 1062 may be arranged under the edge ring 1060. The insulator 1062 may be configured to surround the side surface and an edge portion of a lower surface in the ESC 1020. Further, the insulator 1062 may have an upper surface configured to make contact with the lower surface of the edge ring 1060.

A quartz ring 1064 may be arranged between the insulator 1062 and an inner surface of the plasma chamber 1010. Further, the quartz ring 1064 may include a portion configured to fit between the edge ring 1060 and the inner surface of the plasma chamber 1010.

Because the plasma apparatus is the ICP apparatus 1000, the EO sensor module 210 may be arranged in the vacuum region VR of the plasma chamber 1010. The EO sensor module 210 may extend into the vacuum region VR of the plasma chamber 1010 through a viewport 1014 installed at the vacuum wall 1012.

Figure 21:
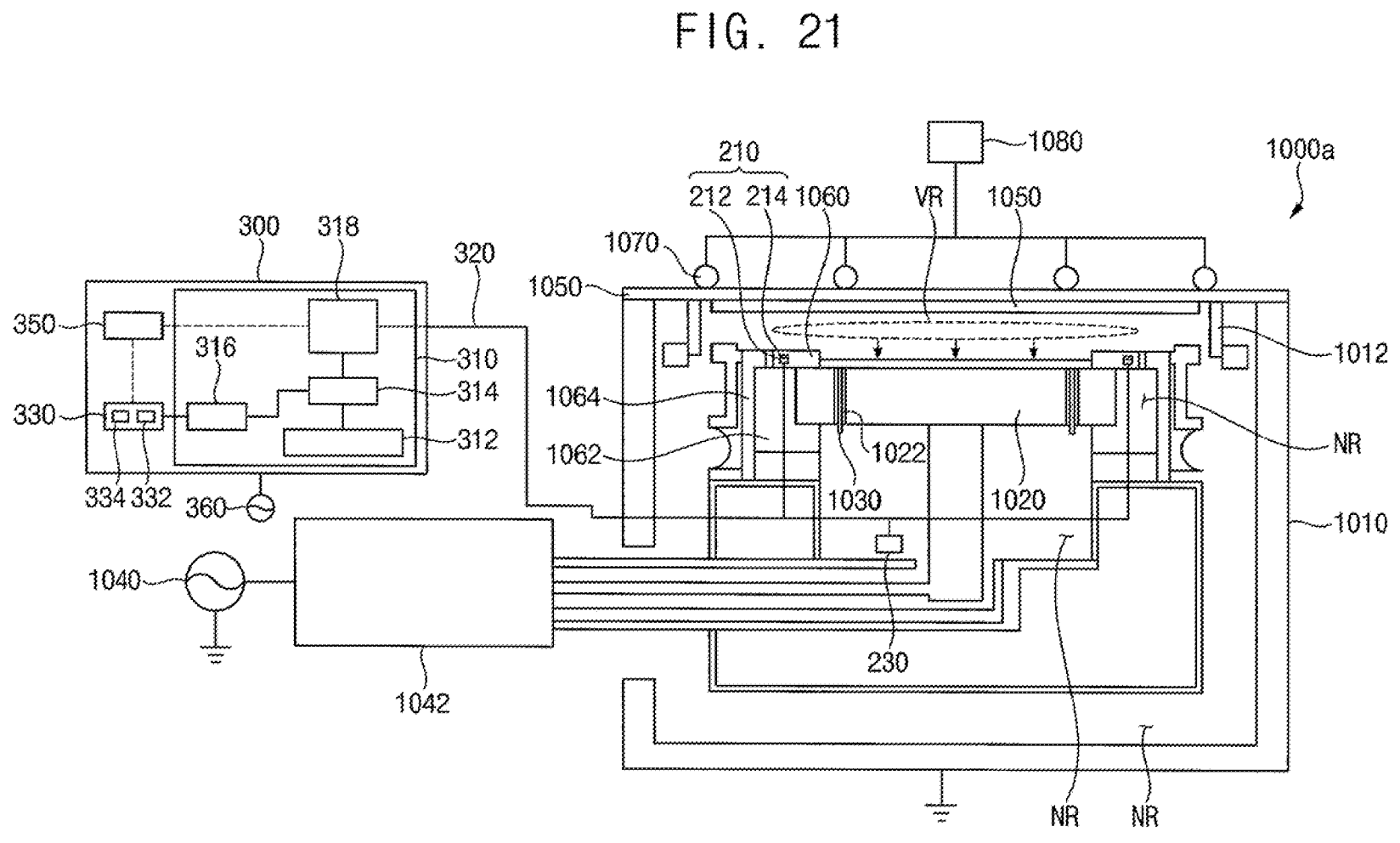

FIG. 21 is a cross-sectional view illustrating an ICP apparatus including the monitoring apparatus in FIG. 1 in accordance with example embodiments.

An ICP apparatus 1000a of this example embodiment may include elements substantially the same as those of the ICP apparatus 1000 in FIG. 20 except for a position of the EO sensor module. Thus, the same reference numerals may refer to the same elements and any further illustrations with respect to the same elements may be omitted herein for brevity.

Referring to FIG. 21, the EO sensor module 210 may be arranged in the edge ring 1060. In particular, the plurality of the EO sensor modules 210 may be arranged in the edge ring 1060 separated by a uniform gap.

Figure 22:
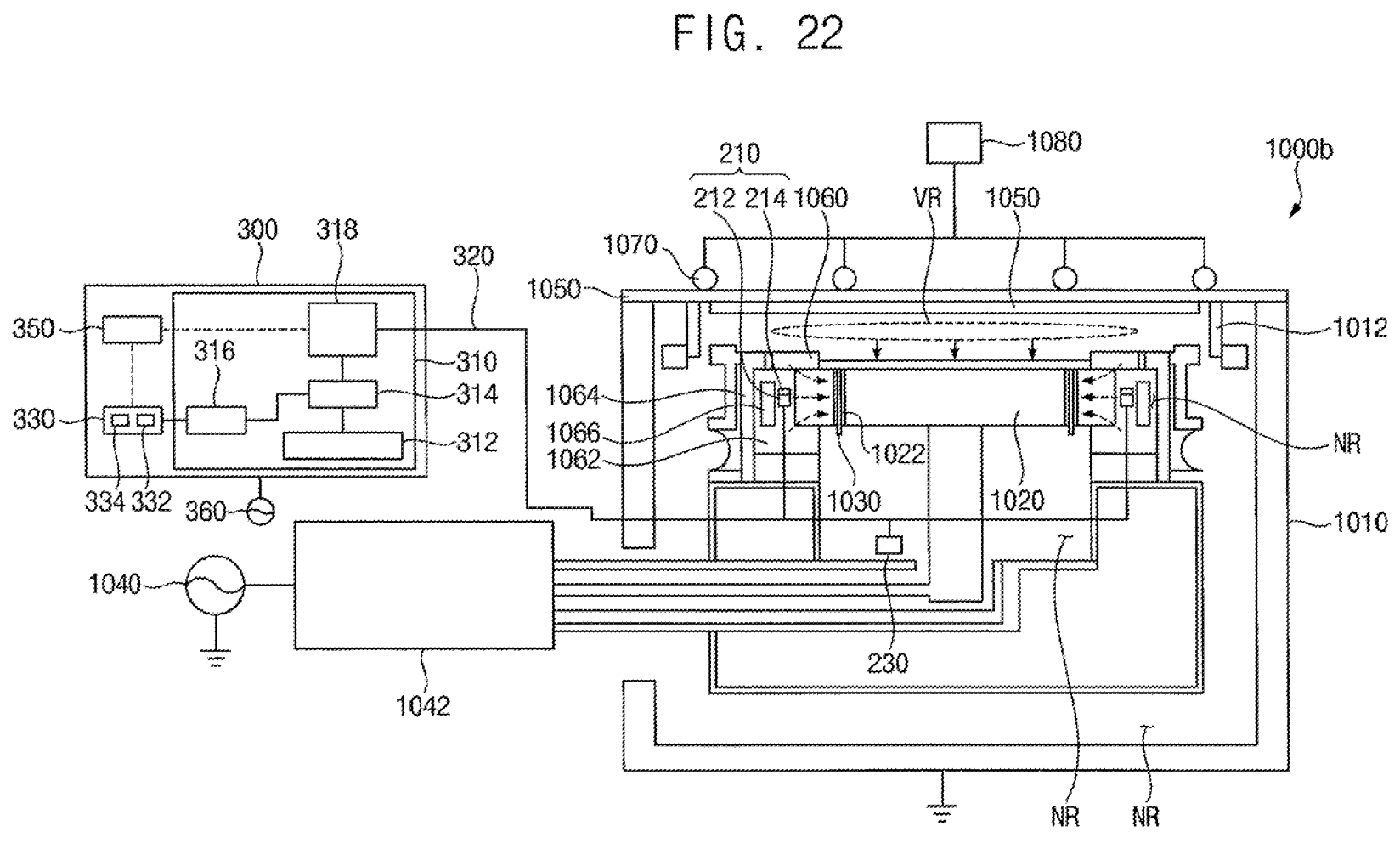

FIG. 22 is a cross-sectional view illustrating an ICP apparatus including the monitoring apparatus in FIG. 1 in accordance with example embodiments.

An ICP apparatus 1000b according to this example embodiment may include elements that are substantially the same as those of the ICP apparatus 1000 in FIG. 20 except for the position of the EO sensor module. Thus, the same reference numerals may refer to the same elements and any further illustrations with respect to the same elements may be omitted herein for brevity.

Referring to FIG. 22, the ICP apparatus 1000b of example embodiments may further include an EBIC ring 1066. The EBIC ring 1066 may be arranged in the insulator 1062. The EBIC ring 1066 may be electrically connected to an RF power.

In example embodiments, the EO sensor module 210 may be arranged within the insulator 1062 between the EBIC ring 1066 and the ESC 1020. Further, a plurality of the EO sensor modules 210 may be arranged in the insulator 1062 between the EBIC ring 1066 and the ESC 1020 separated by a uniform gap.

Figure 23:
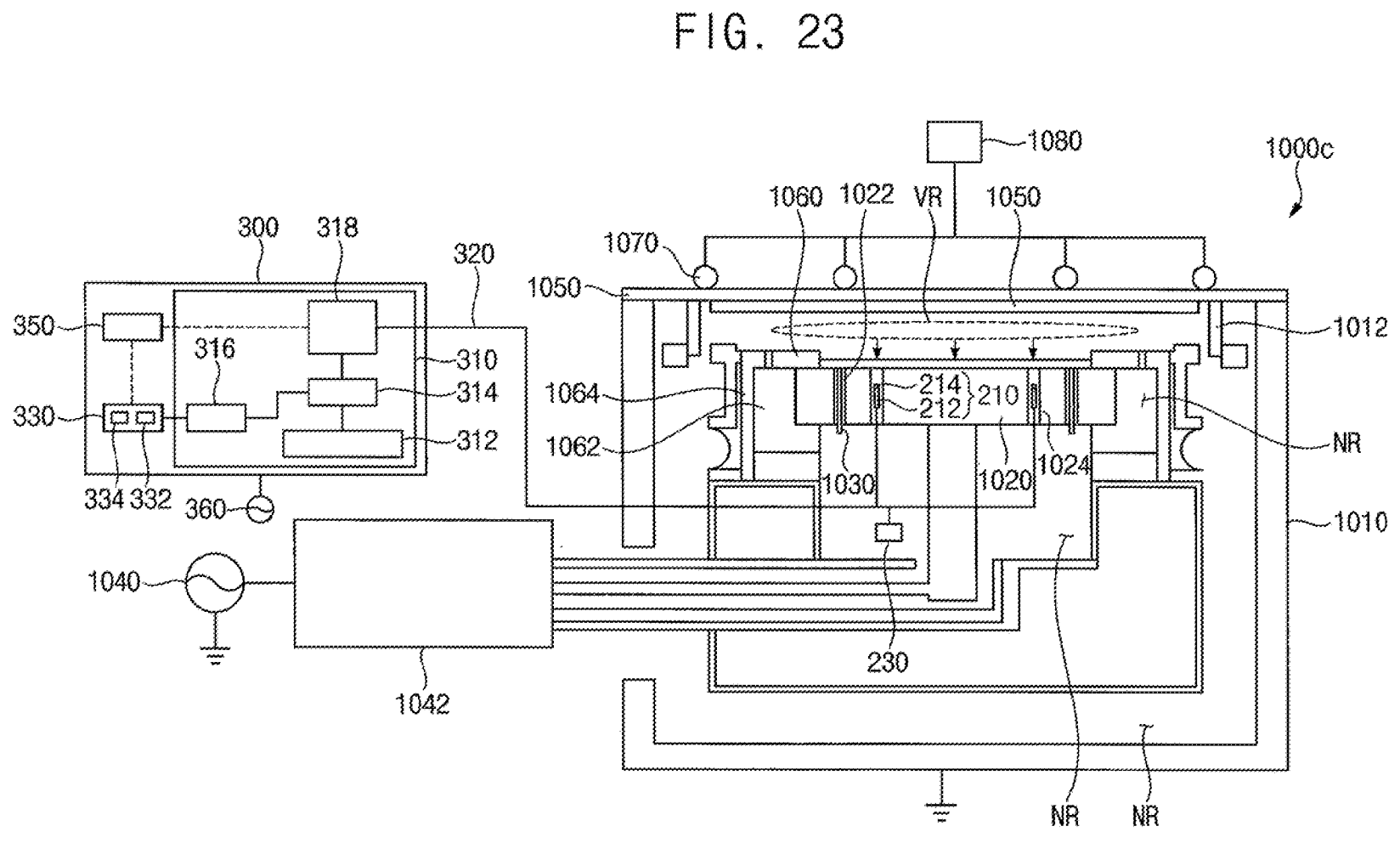

FIG. 23 is a cross-sectional view illustrating an ICP apparatus with the monitoring apparatus in FIG. 1 in accordance with example embodiments.

An ICP apparatus 1000c of this example embodiment may include elements that are substantially the same as those of the ICP apparatus 1000 in FIG. 20 except for the position of the EO sensor module. Thus, the same reference numerals may refer to the same elements and any further illustrations with respect to the same elements may be omitted herein for brevity.

Referring to FIG. 23, the EO sensor module 210 may be arranged in at least one sensing hole 1024 formed through the ESC 1020. A plurality of the sensing holes 1024 may be arranged along a circumferential line of the ESC 1020 separated by a uniform gap. Additionally, the sensing hole 1024 may be arranged at a central portion of the ESC 1020. Thus, the plurality of the EO sensor modules 210 may be arranged in the plurality of the sensing holes 1024.

Figure 24:
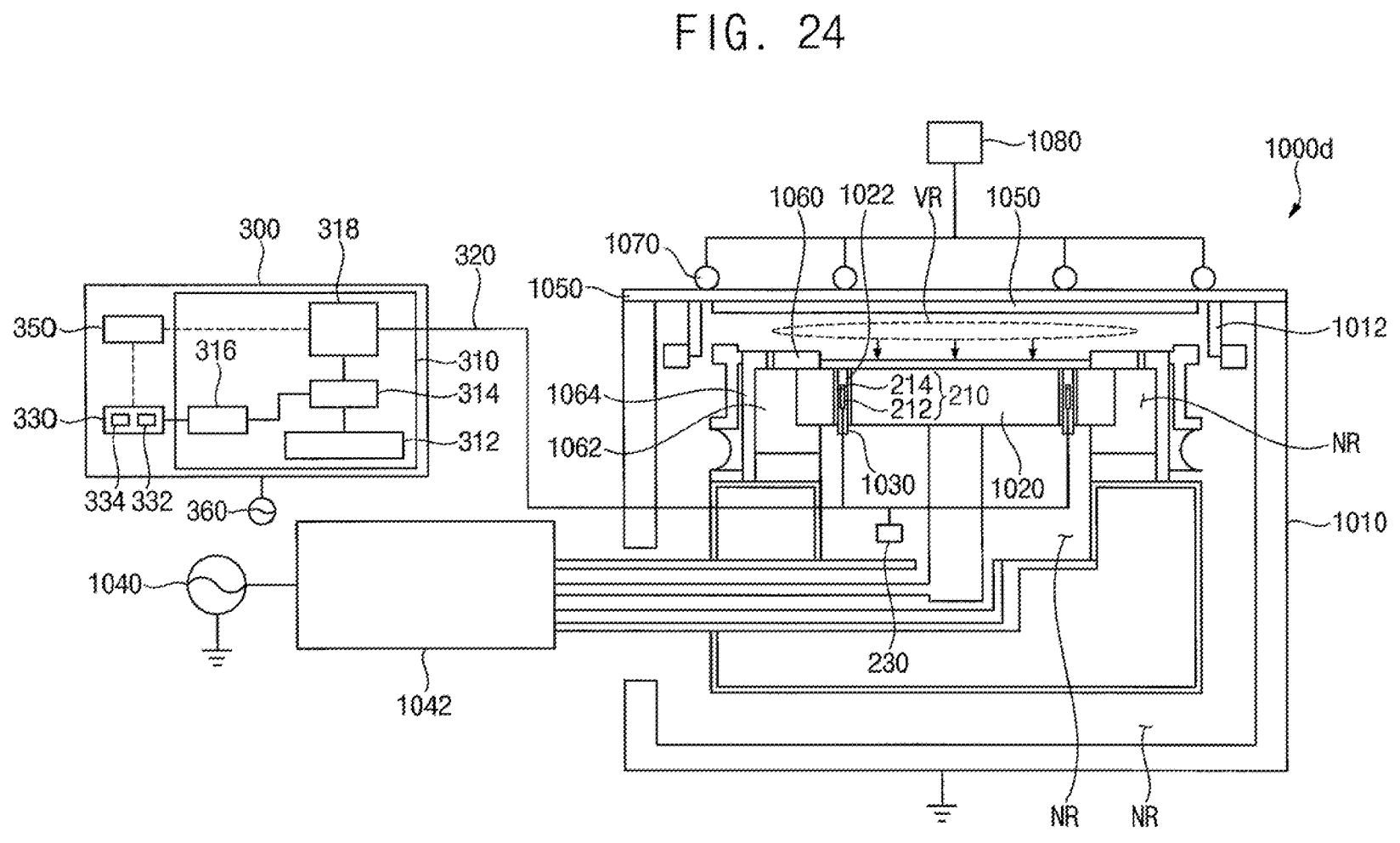

FIG. 24 is a cross-sectional view illustrating an ICP apparatus including the monitoring apparatus in FIG. 1 in accordance with example embodiments.

An ICP apparatus 1000d according to this example embodiment may include elements that are substantially the same as those of the ICP apparatus 1000 in FIG. 20 except for the position of the EO sensor module. Thus, the same reference numerals may refer to the same elements and any further illustrations with respect to the same elements may be omitted herein for brevity.

Referring to FIG. 24, the EO sensor modules 210 may be arranged in the lift pins 1030 to move with the lift holes 1022 of the ESC 1020. That is, the EO sensor modules 210 may move together with the lift pins 1030.

Figure 25:
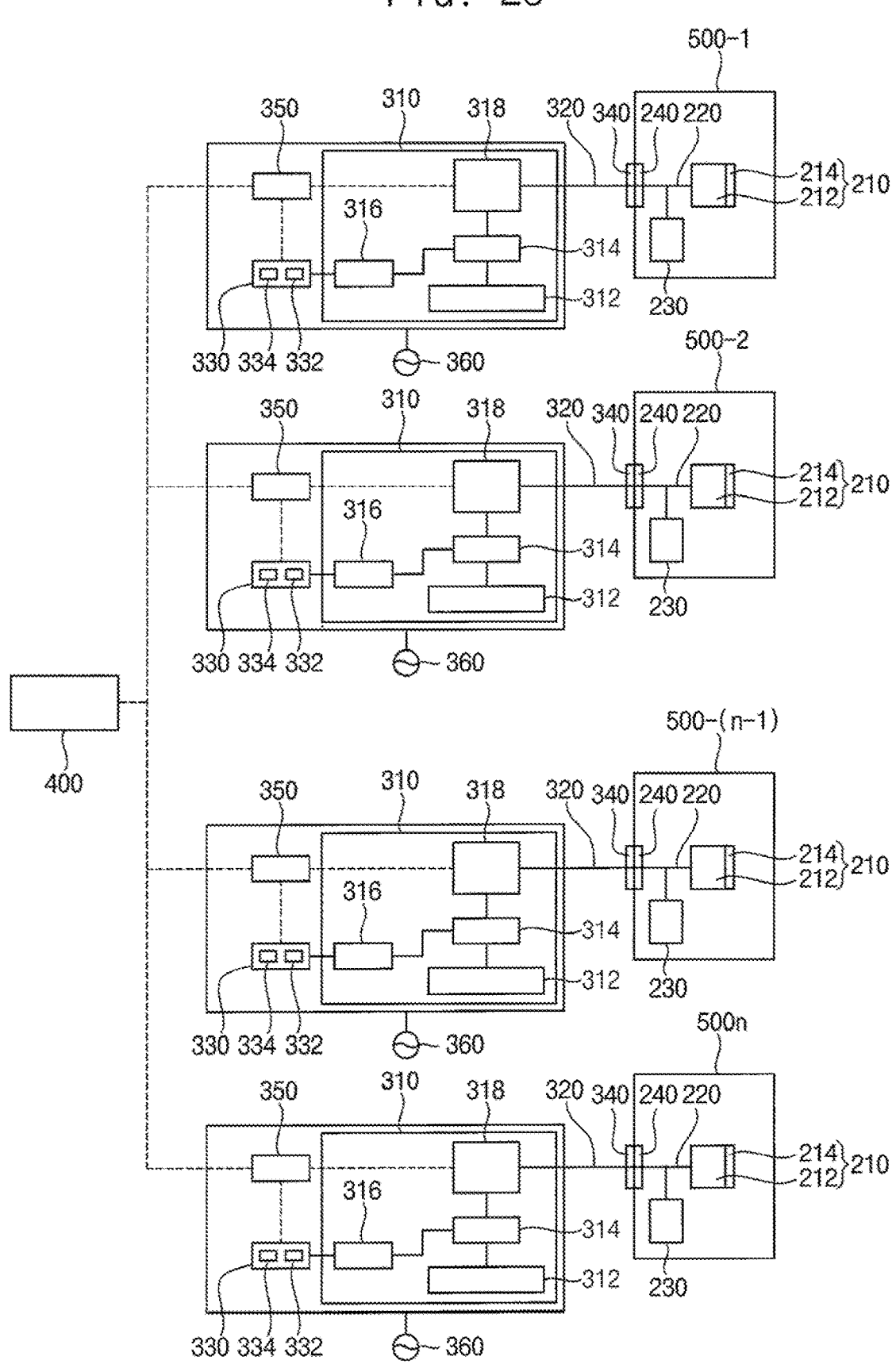
FIG. 25 is a block diagram illustrating a plasma apparatus with the monitoring apparatus in FIG. 1 in accordance with example embodiments.

FIG. 25 is a block diagram illustrating a plasma apparatus with the monitoring apparatus of FIG. 1 in accordance with example embodiments.

Referring to FIG. 25, the monitoring apparatus 100 in FIG. 1 may be arranged in each of a plurality of the plasma apparatuses 500-1~500-n. The monitoring apparatus 100 may individually monitor the plasma processes performed by the plasma apparatuses 500-1~500-n.

Monitoring information with respect to the plasma processes performed by the plasma apparatuses 500-1~500-n may be stored in the control module 350 of each of the monitoring apparatuses 100. The information in the control modules 350 may then be inputted into a main controller 400.

The main controller 400 may perform a control operation for reducing differences between the plasma processes performed by the plasma apparatuses 500-1~500-n based on the stored monitoring information.

Here, the semiconductor devices manufactured by the plasma process to which the monitoring method and the monitoring apparatus are applied in accordance with example embodiments may be included within the scope of the present invention as defined in the claims.

FIGS. 26A and 26B are flow charts illustrating a method of processing a substrate in accordance with example embodiments.

Referring to FIGS. 26A and 26B, in step ST1500, the EO sensor modules 210 may be arranged in the plasma chamber 510. For example, the EO sensors 212 may be arranged in the vacuum region VR in FIG. 4, in the edge ring 560 in FIG. 6, in the insulator 562 between the EBIC ring 566 and the ESC 520 in FIG. 11, in the sensing hole 524 in FIG. 14, in the lift pins 530 in FIG. 17, etc.

In step ST1505, the light source 312 may generate light. The light may then be incident to the polarization controller 318 through the circulator 314.

In step ST1510, the polarization controller 318 may control the polarization characteristic of the light.

In step ST1515, the light may be irradiated to the EO sensor 212 through the single external optical guide 320 and the single internal optical guide 220.

In step ST1520, the semiconductor substrate may be loaded into the plasma chamber 510. The semiconductor substrate may be placed on the upper surface of the ESC 520.

In step ST1525, process gas may be introduced into the plasma chamber 510 to generate the plasma in the plasma chamber 510. The kinds of process gas may be changed in accordance with the desired plasma process. For example, when the plasma process includes a deposition process, an etching process, an ashing process, etc., the kind of the process gas may be changed in accordance with a corresponding process.

In step ST1530, the plasma may be applied to the semiconductor substrate to process the semiconductor substrate. For example, when the plasma process includes a deposition process, a layer may be formed by the plasma on the upper surface of the semiconductor substrate. When the plasma process includes an etching process, a layer on the semiconductor substrate may be etched by the plasma. When the plasma process includes an ashing process, a photoresist layer on the semiconductor substrate may be ashed by the plasma.

In step ST1535, the EO sensors 212 may detect the electric field formed in the plasma chamber 510. For example, the electric field in the plasma chamber 510 may be applied to the EO sensors 212.

In step ST1540, the optical refractive index of each of the EO sensors 212 may be altered by the electric field in the plasma chamber 510.

In step ST1545, the optical characteristic of the light incident to each of the EO sensors 212 may be altered by the altered optical refractive index.

In step ST1550, the incident light may be reflected from the reflector 214 to form the reflected light. The reflected light may then be transmitted to a polarization controller 318 through a single internal optical guide 220 and a single external optical guide 320.

While the incident light and the reflected light is being transmitted through the single internal optical guide 220 and the single external optical guide 320, the cooler 230 may continuously cool the single internal optical guide 220 and the single external optical guide 320.

In step ST1555, the polarization controller 318 may control the polarization characteristic of the reflected light.

In step ST1560, the detector 316 may detect the reflected light. The detected reflected light may then be transmitted to the signal-processing module 330.

In step ST1565, the signal-processing module 330 may convert the optical signal of the reflected light into an electrical signal.

In step ST1570, the filter 332 of the signal-processing module 330 may remove the noise from the electrical signal.

In step ST1575, the amplifier 334 of the signal-processing module 330 may amplify the electrical signal having the noise removed. The amplified electrical signal may then be transmitted to the control module 350.

In step ST1580, the control module 350 may receive the electrical signal converted by the signal-processing module 330. The control module 350 may receive the polarization characteristic of the light controlled by the polarization controller 318. The control module 350 may measure the change of the optical characteristic of the detected light based on the received electrical signal.

As mentioned above, a change of the optical characteristic of a light measured by the control module 350 may correlate with the density of the plasma in the plasma chamber. In particular, when a plurality of EO sensor modules 210 are arranged in the plasma chamber 510, changes of the optical characteristics in the lights measured by the control module 350 may also correlate with a distribution of a plasma density.

Further, the control module 350 may store data such as the electrical signal of the detected light. In particular, the control module 350 may perform a control function of reducing a distribution change between the plasma processes performed by the plasma apparatuses using the data provided from the EO sensor modules 210.

In example embodiments, the operations of the EO sensor modules 210 and the optical measurement module 300 may be performed in the plasma process in real time. That is, the monitoring apparatus 100 of example embodiments may perform the monitoring process in real time during the plasma process.

Further, as shown in FIG. 25, when the plasma apparatus includes a plurality of the plasma chambers 510, the main controller 400 may receive the information stored in each of the control modules 350. The main controller 400 may perform a control operation for reducing differences between the semiconductor processes such as, for example, the plasma processes performed by the plasma apparatuses 500-1~500-*n* based on the stored monitoring information. That is, the main controller 400 may perform a control operation for reducing the differences between the semiconductor processes performed by the plasma apparatuses 500-1~500-*n* based on the difference between the measured optical characteristics in the plasma chambers 510.

FIG. 27 is a flow chart further illustrating methods of processing a substrate in accordance with example embodiments.

Further to FIG. 26A, steps ST1500 to ST1510 illustrated with reference to FIG. 26A may be sequentially performed.

Further to FIG. 27, in step ST1517, the light irradiated into the EO sensors may be incident to the EO sensor 212 through the first external optical guide 322 and the first internal optical guide 222.

Further to FIG. 26A, steps ST1520 to ST1545 illustrated with reference to FIG. 26A may be sequentially performed, and then steps ST1555 to ST1580 illustrated with reference to FIG. 26A may be sequentially performed.

Referring again to FIG. 27, in step ST1552, the incident light may be reflected from the reflector 214 to form the reflected light. The reflected light may then be transmitted to the polarization controller 318 through the second internal optical guide 224 and the second external optical guide 324.

As mentioned above, the incident path of the light may be different from the reflection path of the light. Thus, the method of this example embodiment may not include branching the light into the incident light and the reflected light using the circulator 314.

According to example embodiments, the EO sensor module may include non-conductive material having an optical refractive index changeable by the electric field in the plasma chamber. When light is incident to the EO sensor module, the optical characteristic of the light may be changed by the changed optical refractive index. The changed optical characteristic of the light may be caused by the electric field in the plasma chamber. Thus, a distribution of a plasma density may be accurately monitored based on the optical characteristic change of the light. Particularly, because the EO sensor module including the non-conductive material may not act as noise, the EO sensor module may be arranged in a space where the plasma may be formed or adjacent thereto. As a result, the distribution of the plasma density may be more accurately monitored using the EO sensor module.

A plurality of the EO sensor modules may be arranged in a plurality of regions in the plasma chamber to monitor the distribution of the plasma density by the regions of the plasma chamber.

A plurality of monitoring apparatuses may be installed at a plurality of plasma apparatuses to totally monitor the plasma apparatuses.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

By way of summation and review, embodiments are directed to a method and an apparatus for monitoring a plasma process such that the method and apparatus are capable of accurately measuring a distribution of a plasma density.

Example embodiments also provide a method of processing a substrate using the above-mentioned monitoring method.

What is claimed is:

1. An apparatus for monitoring a plasma process, the apparatus comprising:
   an electro-optical (EO) sensor module arranged in a plasma chamber configured to perform a semiconductor process for processing a substrate using plasma, the EO sensor module including a non-conductive material having an optical refractive index that is changed by an electric field formed in the plasma chamber, wherein the EO sensor module includes an EO sensor arranged entirely within the plasma chamber; and
   an optical guide configured to form at least one internal path of a light, which has an optical characteristic changed by the changed optical refractive index, between the EO sensor module and a wall of the plasma chamber.

2. The apparatus as claimed in claim 1, wherein the EO sensor module further includes:
   a reflector including a non-conductive material to reflect light incident to the EO sensor toward the optical guide.

3. The apparatus as claimed in claim 1, wherein the EO sensor includes an EO crystal.

4. The apparatus as claimed in claim 3, wherein the EO crystal includes $LiTaO_3$, $LiNbO_3$ or ZnTe.

5. The apparatus as claimed in claim 2, wherein the EO sensor module further includes an auxiliary reflector facing the reflector to reflect the light reflected from the reflector toward the EO sensor.

6. The apparatus as claimed in claim 5, wherein the auxiliary reflector has a reflectivity lower than a reflectivity of the reflector.

7. The apparatus as claimed in claim 1, wherein the optical guide forms a single internal path of light between the EO sensor and the plasma chamber.

8. The apparatus as claimed in claim 2, wherein the optical guide includes:
   a first internal optical guide configured to form an internal incident path of the light toward the EO sensor; and
   a second internal optical guide configured to form an internal reflection path of the light reflected from the reflector.

9. The apparatus as claimed in claim 1, wherein the optical guide includes an optical fiber including a non-conductive material.

10. The apparatus as claimed in claim 1, further including an internal optical connector installed at the plasma chamber and connected to the optical guide.

11. The apparatus as claimed in claim 1, further including a cooler configured to cool the optical guide.

12. The apparatus as claimed in claim 1, wherein the EO sensor module is arranged in a vacuum region of the plasma chamber where the plasma is generated.

13. The apparatus as claimed in claim 12, wherein the EO sensor module is arranged at a vacuum wall of the plasma chamber defining the vacuum region.

14. The apparatus as claimed in claim 13, wherein a plurality of the EO sensor modules is installed at the vacuum wall of the plasma chamber by a uniform gap.

15. The apparatus as claimed in claim 1, wherein the EO sensor module is arranged in a remaining non-vacuum region of the plasma chamber other than a vacuum region of the plasma chamber where the plasma is generated.

16. The apparatus as claimed in claim 15, wherein a plurality of the EO sensor modules is arranged in the remaining non-vacuum region of the plasma chamber by a uniform gap.

17. The apparatus as claimed in claim 15, wherein the EO sensor module is arranged in an edge ring surrounding an electrostatic chuck (ESC) in the plasma chamber.

18. The apparatus as claimed in claim 15, wherein the EO sensor module is arranged between an electrostatic chuck and an electron beam induced current (EBIC) ring in the plasma chamber.

19. The apparatus as claimed in claim 15, wherein the EO sensor module is in at least one sensing hole formed through an electrostatic chuck in the plasma chamber.

20. The apparatus as claimed in claim 15, wherein the EO sensor module is arranged in a lift pin that is vertically movable in at least one lifting hole that is formed through an electrostatic chuck in the plasma chamber.

\*   \*   \*   \*   \*